United States Patent
Nguyen

(10) Patent No.: US 11,742,005 B2
(45) Date of Patent: Aug. 29, 2023

(54) SELECTIVELY CROSS-COUPLED INVERTERS, AND RELATED DEVICES, SYSTEMS, AND METHODS

(71) Applicant: Microchip Technology Incorporated, Chandler, AZ (US)

(72) Inventor: Victor Nguyen, San Ramon, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/456,819

(22) Filed: Nov. 29, 2021

(65) Prior Publication Data

US 2022/0284934 A1 Sep. 8, 2022

Related U.S. Application Data

(60) Provisional application No. 63/158,242, filed on Mar. 8, 2021.

(51) Int. Cl.
*G11C 11/417* (2006.01)
*G11C 7/10* (2006.01)
(Continued)

(52) U.S. Cl.
CPC .......... *G11C 7/1084* (2013.01); *G11C 7/1096* (2013.01); *G11C 7/12* (2013.01);
(Continued)

(58) Field of Classification Search
USPC .................................. 365/205, 154, 189.05
See application file for complete search history.

(56) References Cited

U.S. PATENT DOCUMENTS

| 3,654,394 A | 4/1972 | Gordon |
| 4,577,149 A | 3/1986 | Zbinden |

(Continued)

FOREIGN PATENT DOCUMENTS

| EP | 0546702 A1 | 6/1993 |
| EP | 0667678 A2 | 8/1995 |

(Continued)

OTHER PUBLICATIONS

Guoming Lu et al: "When is multi-version checkpointing needed?", Fault-Tolerance for HPC at Extreme Scale, ACM, 2 Penn Plaza, Suite 701 New York NY 10121-0701 USA, Jun. 18, 2013 (Jun. 18, 2013), pp. 49-56, XP058020693, DOI: 10.1145/2465813.2465821, ISBN: 978-1-4503-1983-6, section 2 .1.; p. 50-p. 51; 1gure 2, section 4, first paragraph.; p. 55.

(Continued)

*Primary Examiner* — Connie C Yoha
(74) *Attorney, Agent, or Firm* — TraskBritt

(57) ABSTRACT

An apparatus may include a first inverter and a second inverter cross-coupled between a first node and a second node to store a signal state represented by complementary voltages at the first node and the second node. The apparatus may further include a first path defined by the second inverter that includes an impedance element to resist a flow of charge suitable to change the signal state. The apparatus may further include the first inverter and a third inverter selectively cross-coupled between the first node and the second node to store a received signal state represented by the complementary voltages at the first node and the second node responsive to an assertion of a write enable signal.

22 Claims, 13 Drawing Sheets

(51) Int. Cl.
  *G11C 7/12* (2006.01)
  *G11C 7/14* (2006.01)
  *G11C 11/412* (2006.01)
(52) U.S. Cl.
  CPC .............. *G11C 7/14* (2013.01); *G11C 11/417* (2013.01); *G11C 11/4125* (2013.01)

(56) References Cited

U.S. PATENT DOCUMENTS

| | | |
|---|---|---|
| 5,151,620 A | 9/1992 | Lin |
| 5,552,627 A | 9/1996 | McCollum et al. |
| 6,323,704 B1 | 11/2001 | Pelley et al. |
| 6,326,803 B1* | 12/2001 | Takeda ............. H03K 19/00361 326/86 |
| 6,429,683 B1 | 8/2002 | Miller et al. |
| 7,023,238 B1 | 4/2006 | Camarota |
| 7,098,689 B1 | 8/2006 | Tuan et al. |
| 7,295,459 B2 | 11/2007 | Islam |
| 7,382,168 B2 | 6/2008 | Bhattacharya et al. |
| 8,471,803 B2 | 6/2013 | Jeon et al. |
| 8,633,730 B1 | 1/2014 | Tseng et al. |
| 8,929,125 B2 | 1/2015 | Keeth et al. |
| 9,001,578 B2 | 4/2015 | Kim et al. |
| 9,360,928 B2 | 6/2016 | Pedersen et al. |
| 9,369,124 B2 | 6/2016 | Gunther et al. |
| 9,865,342 B2 | 1/2018 | Lee |
| 10,819,318 B1 | 10/2020 | Britton et al. |
| 2002/0118040 A1 | 8/2002 | Salminen |
| 2003/0016051 A1 | 1/2003 | El-Ayat |
| 2003/0189847 A1 | 10/2003 | Liu et al. |
| 2006/0023503 A1 | 2/2006 | Lee |
| 2007/0075737 A1 | 4/2007 | Schmit et al. |
| 2008/0084237 A1 | 4/2008 | Behrends et al. |
| 2008/0204289 A1 | 8/2008 | Miettinen |
| 2008/0205112 A1 | 8/2008 | Lawson et al. |
| 2008/0253180 A1 | 10/2008 | Nicolaidis et al. |
| 2009/0206875 A1 | 8/2009 | Tran et al. |
| 2009/0303650 A1 | 12/2009 | Do et al. |
| 2011/0001108 A1 | 1/2011 | Greene et al. |
| 2011/0176357 A1 | 7/2011 | Koyama et al. |
| 2012/0063211 A1* | 3/2012 | Sharma ................... G11C 7/08 365/154 |
| 2013/0069905 A1 | 3/2013 | Krah et al. |
| 2013/0126957 A1 | 5/2013 | Higashitani et al. |
| 2013/0308373 A1 | 11/2013 | Shukh |
| 2014/0002162 A1 | 1/2014 | Westwick |
| 2016/0329098 A1* | 11/2016 | Javerliac ............. G11C 11/1659 |
| 2016/0351498 A1 | 12/2016 | Chang et al. |
| 2018/0101495 A1 | 4/2018 | Mackay et al. |
| 2018/0268878 A1 | 9/2018 | Ogiwara et al. |
| 2018/0287614 A1 | 10/2018 | Jo et al. |
| 2019/0228825 A1 | 7/2019 | Hecht et al. |
| 2019/0229734 A1 | 7/2019 | Hecht et al. |
| 2019/0237139 A1 | 8/2019 | Mccollum et al. |
| 2019/0341844 A1 | 11/2019 | Singh et al. |
| 2020/0409879 A1 | 12/2020 | Hull et al. |

FOREIGN PATENT DOCUMENTS

| | | |
|---|---|---|
| EP | 1237278 A1 | 9/2002 |
| EP | 3115869 B1 | 5/2018 |
| WO | 2007/140031 A2 | 12/2007 |
| WO | 2011/062075 A1 | 5/2011 |

OTHER PUBLICATIONS

Hraziia et al Operation and stability analysis of bipolar Non-Volatile 8T2R SRAM as solution for information back-I.up11, Solid State Electron I CS., vol. 90, Dec. 1, 2013 (Dec. 1, 2013), pp. 99-106, XP055577792, GB ISSN: 0038-1101, DOI: -10.1016/j.sse.2013.02. 045, p. 99 p. 101; figures 1.2.

Microchip ATECC608A, CryptoAuthentication(TM) Device Summary Datasheet, DS40001977B (2018) 28 pages.

U.S. Appl. No. 17/304,621, filed Jun. 23, 2021, titled "Recognizing Transistor-Transistor Logic Levels (TTL) at an Input Circuit With Increased Immunity to Static Current Draw", to Devulapalli et al., 34 pages.

Wei Wang et al: "Nonvolatile SRAM Cell", 2012 International Electron Devices Meeting, Dec. 1, 2006 (Dec. 1, 2006), pp. 1-4, XP055577839, ISSN: 0163-1918, DOI: 10.1109/IEDM.2006. 346730, ISBN:978-1-4673-4870-6, col. 1, line 19—col. 2, line 31; figures 1-3.

Wing-Kei Yu et al: "A non-volatile microcontroller with integrated floating-gate transistors", Dependable Systems and Networks Workshops (DSN-W), 2011 IEEE/IFIP 41st International Conference On,EEE, Jun. 27, 2011 (Jun. 27, 2011), pp. 75-80, XP031902956, DOI: 10.1109/DSNW.2011.5958839, ISBN:978-1-4577-0374-4, section I I. B.; p. 76, section IV; p. 77; figure 2.

Xiaoyong Xue et al: "Novel RRAM programming technology for instant-on and high-security FPGAs", ASIC (ASIACON), 2011 IEEE 9th International Conference on, IEEE, Oct. 25, 2011 (Oct. 25, 2011), pp. 291-294, XP032120413, DOI: 10.1109/ASICON. 2011.6157179, ISBN: 978-1-61284-192-2 section 3.2.; figure 7.

International Search Report from International Application No. PCT/US2021/072622, dated Mar. 18, 2022, 6 pages.

International Written Opinion from International Application No. PCT/US2021/072622, dated Mar. 18, 2022, 8 pages.

\* cited by examiner

SELECTIVELY CROSS-COUPLED INVERTERS, AND RELATED DEVICES, SYSTEMS, AND METHODS

CROSS-REFERENCE TO RELATED APPLICATION

This application claims the benefit under 35 U.S.C. § 119(e) of U.S. Provisional Patent Application Ser. No. 63/158,242, filed Mar. 8, 2021, the disclosure of which is hereby incorporated herein in its entirety by this reference.

TECHNICAL FIELD

This description relates, generally, to selectively cross-coupled inverters. More specifically, various examples relate to storage elements including selectively cross-coupled inverters, without limitation. Related devices, systems, and methods are also disclosed.

BACKGROUND

Some storage elements (e.g., volatile storage elements, without limitation) include one or more transistors. Some transistors may be affected by single-event upsets (SEUs). An SEU may be a change of state at the transistor caused by an ionizing particle (e.g., an ion, an electrons, or a photon, without limitation) striking a sensitive node in the transistor (e.g., a source or a drain of the transistor, without limitation).

BRIEF DESCRIPTION THE DRAWINGS

While this disclosure concludes with claims particularly pointing out and distinctly claiming specific examples, various features and advantages of examples within the scope of this disclosure may be more readily ascertained from the following description when read in conjunction with the accompanying drawings, in which:

DETAILED DESCRIPTION

Figure 1A:
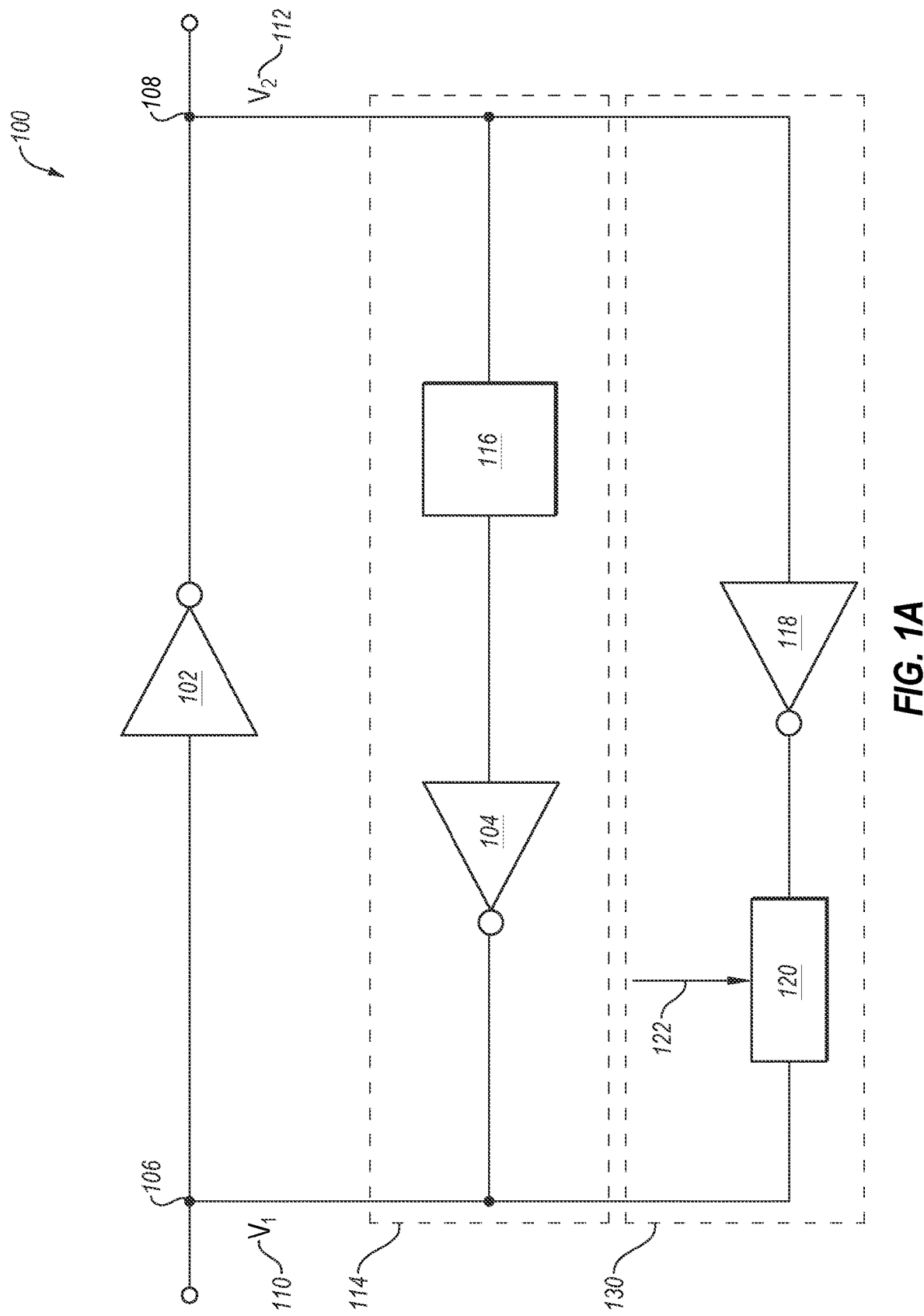
FIG. 1A is a functional block diagram illustrating an example circuit according to one or more examples.

In the following detailed description, reference is made to the accompanying drawings, which form a part hereof, and in which are shown, by way of illustration, specific examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example of this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure, but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be depicted by block diagram form in order not to obscure the present disclosure in unnecessary detail. Conversely, specific implementations shown and described are only examples and should not be construed as the only way to implement the present disclosure unless specified otherwise herein. Additionally, block definitions and partitioning of logic between various blocks is an example of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, and symbols that may be referenced throughout this description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal. A person having ordinary skill in the art would appreciate that this disclosure encompasses communication of quantum information and qubits used to represent quantum information.

In the present disclosure, the terms "single event upset" and "SEU" refer to a change in state of the source node or drain node of a transistor resulting from one or more ionizing particles affecting the transistor. For example, a source node or drain node of a transistor may be struck by a heavy ion which may cause an influx of electron-hole pairs which may drive the source node or drain node higher or lower in voltage. The higher or lower voltage at the source node or drain node of the transistor may result in a change in a state (e.g., "on" to "off" or "off" to "on") of the transistor. Thus, in the present disclosure, the term SEU may be applied to a transistor to indicate that the transistor has changed state based on an SEU. And, in the present disclosure, the term SEU may be applied to a device (e.g., a volatile storage element, without limitation) to indicate that the device has changed state based on an SEU, for example, a bit of data stored by the volatile storage element may change as a result of the SEU.

In the present disclosure, the terms "single-event-upset resistant," or "SEU resistant," may refer to a state of being more resistant to SEU than another system, circuit, or device. In particular, an SEU-resistant system, circuit, or device may include one or more elements that may allow the SEU-resistant system, circuit, or device to be less likely to experience an SEU than systems, circuits, or devices that do not include the one or more elements.

Additionally or alternatively, SEU resistance may improve a system, circuit, or device by making the system, circuit, or device more resistant to events that may disturb a state of a latch of the system, circuit, or device. For example, SEU resistance may improve how a system, circuit, or device responds to an event that enables a word line for a short period of time. Examples of events that may enable a word line for a short period of time include user error or a bug in a control system that drives a word line without limitation.

In the present disclosure, the term "volatile storage element" refers to a cell of data storage that requires power to store information. Examples of volatile storage elements include, but are not limited to: latch circuits, flip-flop circuits, and circuits including cross-coupled inverters. Some field-programmable gate arrays (FPGAs) include configuration cells including volatile storage elements. Also, static random-access memory (SRAM) cells include volatile storage elements.

In general, volatile storage elements may be affected by SEUs. As a non-limiting example, a transistor node of an inverter of a pair of cross-coupled inverters of a volatile storage element may change states in response to an SEU, and as a result, a bit of data stored by the volatile storage element may change.

One way to increase SEU resistance known to the inventor of this disclosure is to include an impedance element in a circuit including elements vulnerable to SEU. For example, including an impedance element in a path of a loop between cross-coupled inverters (e.g., in a volatile storage element, without limitation), may increase a time constant (e.g., RC time) of a circuit including the cross-coupled inverters. Because of the increased time constant, SEUs, which are short in duration, are less likely to affect a state of the cross-coupled inverters. For example, one or more cross-coupled inverters implemented by transistors may change states as a result of an SEU. If an impedance element is present in a circuit with the transistors, the impedance element may resist a rapid change of voltage across the transistors and may cause the one or more cross-coupled inverters to revert to their pre-SEU state. An impedance element may be an element characterized by a resistance to an inducement of a flow of a charge suitable to change the state of the volatile storage device. Examples of impedance elements include a resistive random-access memory (ReRAM), an anti-fuse, or a vertical resistor without limitation.

Including an impedance element in a volatile storage element may come with trade-offs. Adding an impedance element to conventional volatile storage elements may increase the write time of such a volatile storage element unless the write line voltage were increased. In some cases, increased write line voltage or an increased write time of a volatile storage element may be undesirable.

Various examples of the present disclosure may increase SEU resistance of a volatile storage element without (or with less of) a trade-off of higher write-line voltage or longer write time of other approaches to increase SEU resistance. As a non-limiting example, various examples may increase SEU resistance while limiting write times of volatile storage elements (e.g., to around 100 ns or less, without limitation). Further, various examples may increase SEU resistance of a volatile storage element with a corresponding increase in size (e.g., physical size of the volatile storage element, e.g., on a die, without limitation) of about 60% as compared to a volatile storage element without disclosed SEU resistance. A size increase of about 60% may be an improvement over other approaches to increase SEU resistance which may result in an increase in size of over 60%.

FIG. 1A is a functional block diagram illustrating an example circuit 100 according to one or more examples. Circuit 100 may exhibit SEU resistance without exhibiting an increased write time. As depicted in FIG. 1A, circuit 100 may include first inverter 102 and second inverter 104 cross-coupled between first node 106 and second node 108. As depicted in FIG. 1A, first node 106 may exhibit first voltage 110 ($V_1$) and second node 108 may exhibit second voltage 112 ($V_2$). As depicted in FIG. 1A, circuit 100 may define first path 114 including second inverter 104 and impedance element 116 connected in series. As depicted in FIG. 1A, circuit 100 may also include third inverter 118 and switching circuit 120 coupled in parallel with first path 114, and optionally defining a second path 130. As depicted in FIG. 1A, switching circuit 120 may receive write enable signal 122.

Figure 11:
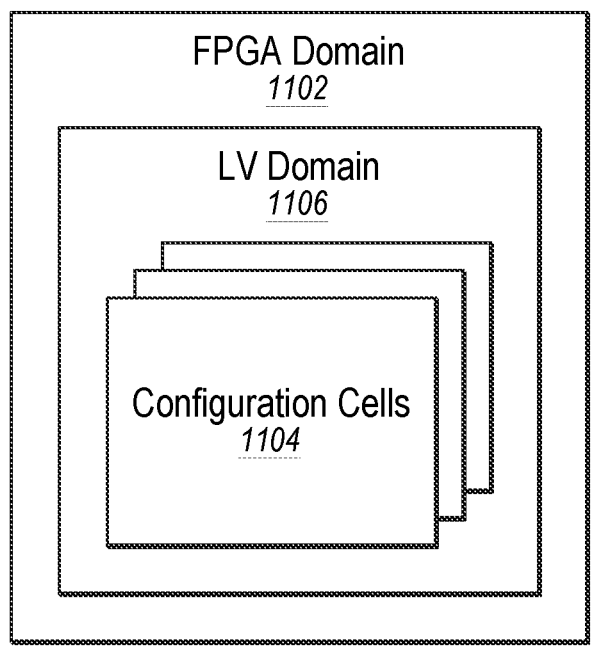
FIG. 11 is a functional block diagram illustrating an example field programmable gate array according to one or more examples.

As a non-limiting example, circuit 100 may be one of an array of similar or identical configuration cells of a field programmable gate array (FPGA) (e.g., as illustrated by configuration cells 1104 of FPGA 1102 of FIG. 11). As another non-limiting example, circuit 100 may be one of an array of similar or identical memory cells of a memory array (e.g., as illustrated by SEU-resistant memory cells 1204 of memory array 1202 of FIG. 12). According to examples described herein, an array of cells (configuration cells or memory cells) may be SEU resistant. Thus, the configuration cells 1104 of FIG. 11 may be SEU resistant and the memory array 1202 of FIG. 12 may be SEU resistant.

First inverter 102 and second inverter 104 may collectively store a signal state represented by complementary voltages e.g., first voltage ($V_1$) 110 first node 106 and second voltage ($V_2$) 112 at second node 108.

Impedance element 116 resists a flow of charge (e.g., caused by an SEU) from second node 108 to an input of second inverter 104 suitable to change first voltage 110 (which represents the signal state at first node 106). For example, impedance element 116 may resist a change in voltage at second node 108 (and at an input of second inverter 104) for a time duration. During the time duration, first voltage 110 at the output of second inverter 104 and at the input of first inverter 102 may remain unchanged. As a result of the unchanged first voltage 110 at the input of first inverter 102, first inverter 102 may invert first voltage 110 and provide the inverted voltage (i.e., second voltage 112) at second node 108. Thus, for the time duration, impedance element 116 may cause second inverter 104 and first inverter 102 to resist a change and/or to remain in their pre-change state. Thus, in order to change a signal state of first inverter 102 and second inverter 104 an external voltage may need to hold one or both of first node 106 and second node 108 at a new signal state for longer than the time duration. Circuit 100, including first inverter 102, second inverter 104, and impedance element 116, may be SEU resistant because an SEU may be shorter than the time duration. Thus, though an SEU may change a state of one or both of first inverter 102 and second inverter 104, impedance element 116 may resist the changed state and may cause first inverter 102 and second inverter 104 to revert to their pre-SEU state. In other words, impedance element 116 may prevent circuit 100 from latching a new state unless the new state persists for a timer duration longer than a time constant of the first path 114. And, an SEU (affecting either of first inverter 102 or second inverter 104) may not persist longer than the time duration.

Third inverter 118 in second path 130 (e.g., a bypass path) is selectively cross-coupled to first inverter 102 (e.g., between first node 106 and second node 108). Third inverter 118 and first inverter 102 may collectively store the signal state represented by the complementary voltages at first node 106 and second node 108. Third inverter 118 may be selectively cross-coupled to first inverter 102 by switching circuit 120. In particular, if switching circuit 120 is closed, third inverter 118 (i.e., of second path 130) may be cross-coupled to first inverter 102 and if third inverter 118 is open, third inverter 118 may not be cross-coupled to first inverter 102. Second path 130 may be enabled, by closing switching circuit 120, such that third inverter 118 and first inverter 102 hold a new signal state for at least the time duration such that first inverter 102 and second inverter 104 will thereafter hold the new signal state, irrespective of the state of switching circuit 120, which switching circuit 120 may then be opened.

As an example of operation of circuit 100, first inverter 102 and second inverter 104 may hold an original signal state and may be SEU resistant. During a write operation, first inverter 102 and third inverter 118 may receive a new signal state and may hold the new signal state until the resistance to change of voltage of impedance element 116 is overcome and second inverter 104 receives the new signal state. Thereafter, third inverter 118 may be disconnected from first inverter 102 and first inverter 102 and second inverter 104 may hold the new signal state and provide SEU immunity.

Switching circuit 120 may operate (e.g., open or close) according to write enable signal 122. Write enable signal 122 may be indicative of a write operation.

Each of first inverter 102, second inverter 104, and third inverter 118 may be any suitable inverter e.g., an inverter comprised of two or more transistors, without limitation. Impedance element 116 may be any suitable resistive element, including, as non-limiting examples a virgin resistive random-access memory (ReRAM), an anti-fuse, or a vertical resistor. In one example, impedance element 116 may be provide an impedance of at least one megaohm (>=1 MΩ).

In various examples, impedance element 116 may be positioned on either side of second inverter 104 i.e., between second node 108 and second inverter 104 or between second inverter 104 and first node 106. In various examples, switching circuit 120 may be positioned in line with third inverter 118 and may be configured to disconnect third inverter 118 from a circuit including first inverter 102. In other examples, switching circuit 120 may be configured to disconnect third inverter 118 from a power source thereby disabling third inverter 118.

Figure 1B:
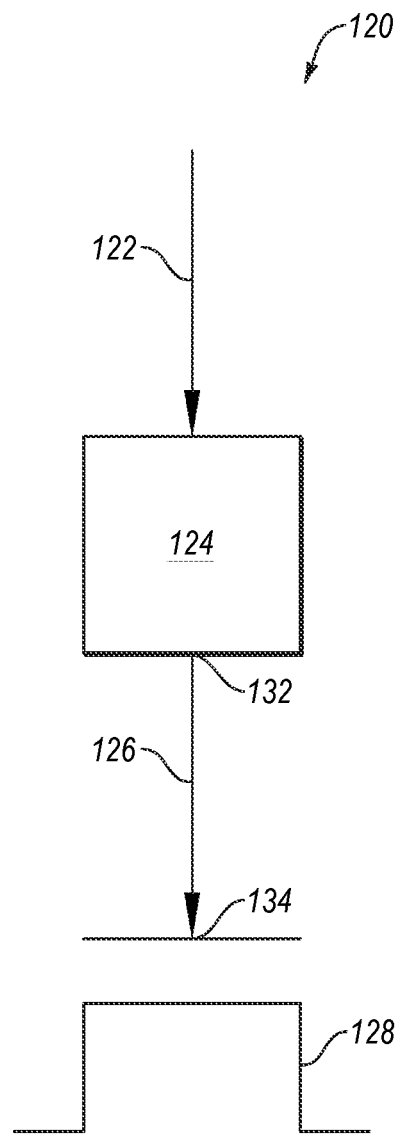
FIG. 1B is a functional block diagram illustrating an example switching circuit according to one or more examples.

FIG. 1B is a functional block diagram illustrating an example switching circuit 120 according to one or more examples. Switching circuit 120 may control switch 128 to selectively cross-couple an inverter (e.g., third inverter 118 of FIG. 1A) to another inverter (e.g., first inverter 102 of FIG. 1A). Additionally or alternatively, switching circuit 120 may control switch 128 to selectively enable or disable a path (e.g., the second path 130 of FIG. 1A) between a first node (e.g., first node 106 of FIG. 1A) and a second node (e.g., second node 108 of FIG. 1A). As depicted in FIG. 1B, switching circuit 120 includes control circuit 124 and switch 128. As depicted in FIG. 1B, control circuit 124 may receive write enable signal 122. As depicted in FIG. 1B, control circuit 124 may provide control signal 126 at output 132 of control circuit 124 to input 134 of switch 128.

Figure 3:
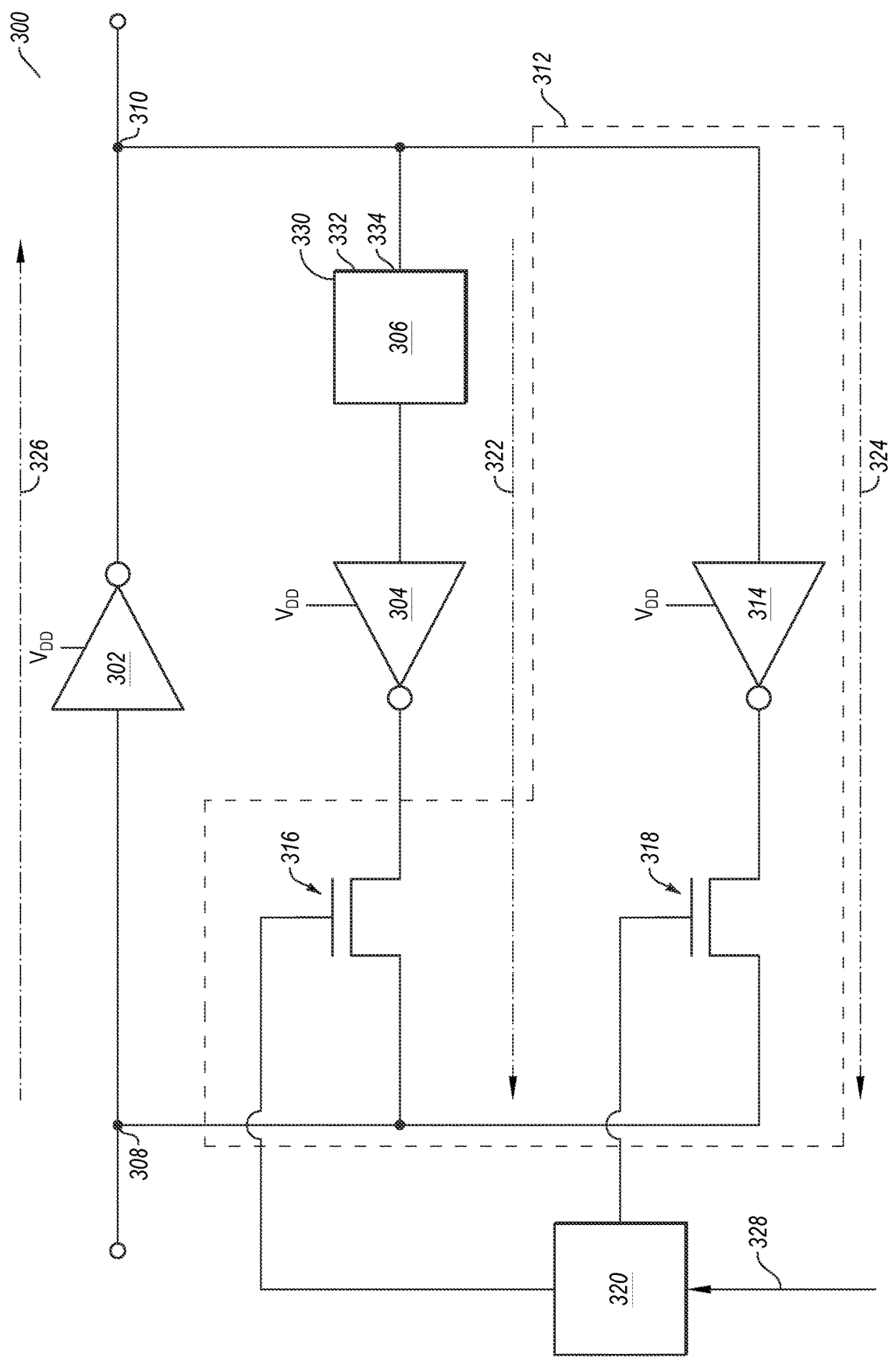
FIG. 3 is a functional block diagram illustrating another example circuit according to one or more examples.

Switch 128 may be in line with the path (e.g., as illustrated and described with relation to FIG. 3). Additionally or alternatively, switch 128 may be between a power supply and a voltage supply lead of an inverter (e.g., as illustrated and described with relation to FIG. 4).

Switching circuit 120 includes control circuit 124 which may control operation (e.g., opening and closing) of switch 128 responsive to write enable signal 122. For example, output 132 of control circuit 124 may be coupled to input 134 of switch 128, which input 134 may be an enable input. Control circuit 124 may provide control signal 126 to switch 128 according to assertion and de-assertion of write enable signal 122. Control signal 126 may include an indication of a state of write enable signal 122.

Additionally or alternatively, control circuit 124 may include timing and may provide control signal 126 in a first state to close switch 128 for a first predetermined time duration after assertion of write enable signal 122. Additionally or alternatively, control circuit 124 may provide control signal 126 in a second state to open switch 128 after the first predetermined time duration.

Figure 2:
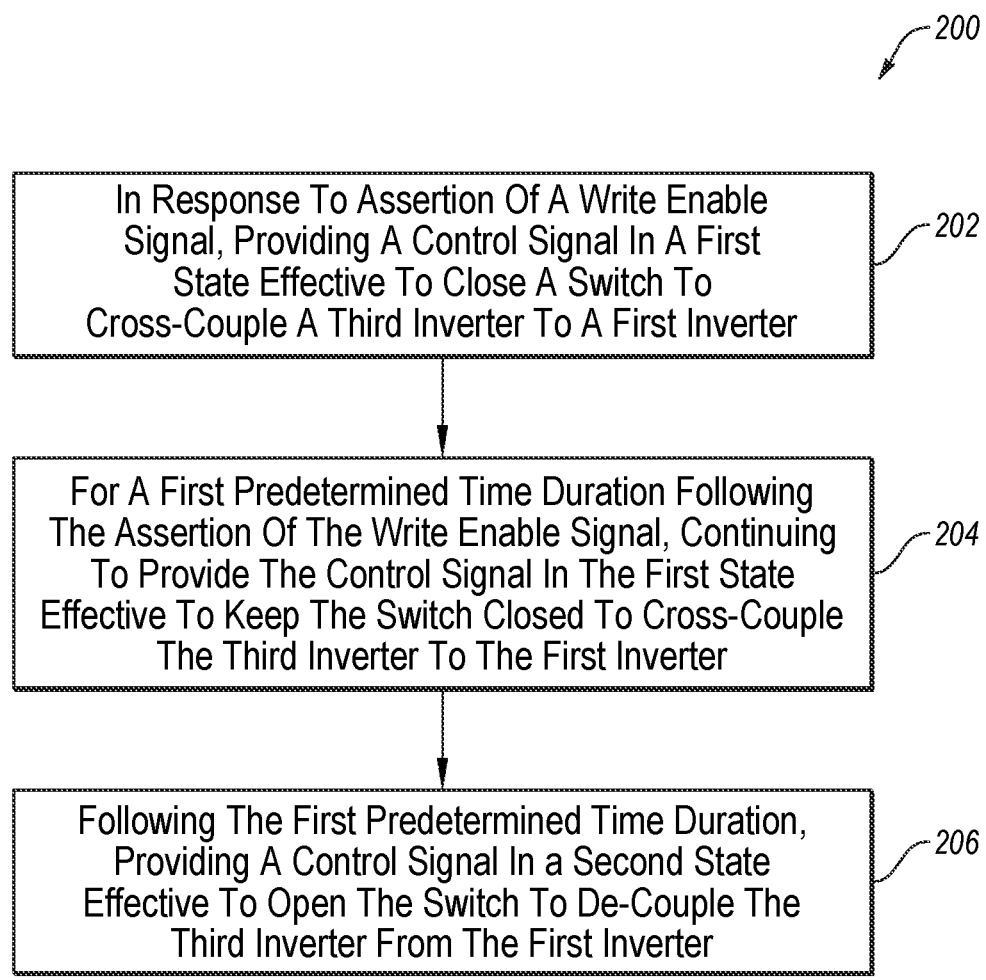
FIG. 2 is a flowchart of an example method of operating a switch, according to one or more examples.

Control circuit 124 may perform one or more operations of method 200 of FIG. 2.

FIG. 2 is a flowchart of an example method 200 of operating a switch, according to one or more examples. As an example, method 200 may be method of operating switch 128 of FIG. 1A and FIG. 1B. At least a portion of method 200 may be performed, in various examples, by a device or system, such as control circuit 124 of FIG. 1B or another device or system. Although illustrated as discrete operations, various operations may be divided into additional operations, combined into fewer operations, or eliminated, depending on the desired implementation.

At operation 202, in response to assertion of a write enable signal, a control signal in a first state may be provided. The control signal in the first state may be effective to close a switch to cross-couple a third inverter to a first inverter. Write enable signal 122 of FIG. 1A and FIG. 1B may be an example of the write enable signal of method 200. Control signal 126 of FIG. 1B may be an example of the control signal of method 200. Switch 128 of FIG. 1B may be an example of the switch of method 200. Third inverter 118 of FIG. 1A may be an example of the third inverter of method 200. First inverter 102 of FIG. 1A may be an example of the first inverter of method 200.

At operation 204, for a first predetermined time duration following the assertion of the write enable signal, the control signal in the first state may continue to be provided. The control signal in the first state may be effective to keep the switch closed to cross-couple the third inverter to the first inverter.

At operation 206, following the first predetermined time duration, a control signal in a second state may be provided. The control signal in the second state may be effective to open the switch so as to de-couple the third inverter from the first inverter.

The first predetermined time duration of method 200 may be related to a time constant of the first path 114 of FIG. 1A. For example, the first predetermined time duration may be greater than the time constant of the first path 114. For example, first the predetermined time duration may be a multiple of the time constant of the first path 114.

FIG. 3 is a functional block diagram illustrating another example circuit 300 according to one or more examples. Like circuit 100, circuit 300 may exhibit SEU resistance without exhibiting an increased write time. As depicted in FIG. 3, circuit 300 includes first inverter 302 selectively cross-coupled to second inverter 304 between first node 308 and second node 310. As depicted in FIG. 3, circuit 300 defines forward path 326 (including first inverter 302) between first node 308 and second node 310. As depicted in FIG. 3, circuit 300 defines first path 322 between second node 310 and first node 308. As depicted in FIG. 3, first path 322 includes impedance element 306, second inverter 304, and enable switch 316. As depicted in FIG. 3, circuit 300 defines second path 324 between second node 310 and first node 308. As depicted in FIG. 3, second path 324 includes third inverter 314 and bypass switch 318. As depicted in FIG. 3, circuit 300 includes bypass circuit 312 including enable switch 316, bypass switch 318, and third inverter 314. As depicted in FIG. 3, circuit 300 includes control circuit 320 which receives write enable signal 328.

Circuit 300 may include cross-coupled inverters (e.g., first inverter 302 and second inverter 304) e.g., arranged to form a volatile-storage element according to one or more examples. Circuit 300 may additionally include impedance element 306 in a path (e.g., first path 322) between the pair of cross-coupled inverters (e.g., first inverter 302 and second inverter 304). The impedance element 306 may increase SEU resistance of circuit 300. Additionally, circuit 300 may include additional elements (including, e.g., third inverter 314, enable switch 316, and bypass switch 318) to mitigate the increase in write-time that is the result of adding an impedance element to a path between cross-coupled inverters.

First inverter 302, second inverter 304, and third inverter 314, may be any suitable inverter e.g., an inverter comprised of two or more transistors, without limitation. Each of first inverter 302, second inverter 304, and third inverter 314 may be configured to receive a voltage signal at an input and provide an opposite voltage signal at an output. Each of first inverter 302, second inverter 304, and third inverter 314, may be electrically coupled between a pair of voltage lines, e.g., $V_{DD}$ and $V_{SS}$ ($V_{SS}$ not illustrated in FIG. 3), without limitation.

Impedance element 306 may be a resistive element with high impedance, e.g., 1 megaohm, 1 gigaohm, or more, without limitation. Impedance element 306 may be any suitable resistive element, including, as non-limiting examples virgin resistive random-access memory (ReRAM) 330, anti-fuse 332, or vertical resistor 334.

Enable switch 316 and bypass switch 318 may be any suitable switch, e.g., N-type metal-oxide semiconductor (NMOS) transistor, without limitation. Enable switch 316 and bypass switch 318 may, or may not, be the same type of switch. Each of enable switch 316 and bypass switch 318 may operate (e.g., open or close) in response to a voltage difference (e.g., 0.8 V or 1.7 V, without limitation) between a gate voltage and a source voltage.

Circuit 300 includes a forward path 326 between first node 308 and second node 310 through first inverter 302. Circuit 300 further includes two return paths from second node 310 to first node 308. In particular, circuit 300 includes first path 322 through impedance element 306, second inverter 304, and enable switch 316, and second path 324 through third inverter 314 and bypass switch 318. Circuit 300 may be operated such that one or more of the return paths, i.e., one or more of first path 322 and second path 324, may be active while circuit 300 is operative i.e., one or both of enable switch 316 and bypass switch 318 may be closed while power is supplied to circuit 300.

Circuit 300 may have three modes of operation: an impedance mode wherein forward path 326 and first path 322 may be operative (i.e., allow current to flow therein), a bypass mode wherein forward path 326 and second path 324 may be operative, and a dual-path mode wherein forward path 326 and both first path 322 and second path 324 may be operative. When enable switch 316 is closed and bypass switch 318 is open, circuit 300 is in the impedance mode, when enable switch 316 is open and bypass switch 318 is closed, circuit 300 is in the bypass mode, and when enable switch 316 is closed and bypass switch 318 is closed, circuit 300 is in the dual-path mode.

Circuit 300 (whether in the impedance mode, the bypass mode, or the dual-path mode) includes a configuration commonly referred to as a flip flop or latch. The latch configuration includes first inverter 302 and second inverter 304 (or third inverter 314) cross-coupled to one another. In particular, an output of first inverter 302 is electrically coupled to an input of second inverter 304 (and to third inverter 314) and output of second inverter 304 (or third inverter 314) is electrically coupled to an input of first inverter 302.

The latch configuration is bistable, meaning, the voltage states of first node 308 and second node 310 will remain stable at one of two states. In particular, the latch configuration is stable if there is a "high" voltage state (e.g., a voltage selected to represent a binary "1") at first node 308 and a "low" voltage (e.g., a voltage selected to represent a binary "0") at second node 310 alternatively, this configuration is stable if there is a "low" voltage at first node 308 and a "high" voltage at second node 310. As long as first inverter 302 and second inverter 304 are each supplied with $V_{DD}$, the latch configuration can maintain either of these stable states. Thus, circuit 300, by maintaining one of the two states at first node 308 and the other of the two states at second node 310, can be used to store data e.g., as a single memory cell storing a binary value, without limitation. In the present disclosure, a state stored at first node 308 and the opposite state stored at second node 310 may be referred to as a "state" of the latch configuration, or a "state" of circuit 300.

Circuit 300 may be one of many similar or identical circuits arranged in an array and accessible by individual combinations of bit lines (BLs) and word lines (WLs) e.g., through an access switch (not illustrated). As non-limiting examples, circuit 300 may be one of an array of configuration cells of an FPGA (e.g., as illustrated by configuration cells 1104 of FPGA 1102 of FIG. 11) or one of an array of memory cells (e.g., as illustrated by memory cells 1204 of memory array 1202 of FIG. 12). One or more of the cells of the array may be accessed during a read operation or write operation.

A state maintained by circuit 300 may be accessed to be "read" (i.e., observed) or "written" (i.e., set, whether altered or not) through the access switch e.g., arranged to couple a BL, or a WL, to first node 308. As a non-limiting example, in a read operation, the access switch may be closed and the voltage state of first node 308 (e.g., "high" or "low," without limitation) may be observed or the voltage state of second node 310 may be observed. In a write operation, a voltage state may be transferred from the BL, or WL, to first node 308 by charging the BL, or WL, and closing the access switch to transfer charge from the BL, or WL, to first node 308.

Impedance element 306 may increase the SEU resistance of circuit 300 (while circuit 300 is in impedance mode) by increasing the time constant of the latch configuration of circuit 300. As a non-limiting example, impedance element 306 may increase the time needed to change a voltage at an input of second inverter 304 responsive to a voltage change at second node 310. Thus, an SEU, which inherently has a short duration, may not change the voltage at first node 308 or second node 310 long enough to change the state of circuit 300 in impedance mode. Thus, the state of first inverter 302 and second inverter 304 may remain unchanged (or revert to its pre-SEU state), despite the SEU.

However, by increasing the time needed to change a state of circuit 300, a write time of circuit 300 (in impedance mode) may also be increased as compared to a latch without impedance element 306. An increased write time for a memory cell may be undesirable for some applications.

Bypass circuit 312 may improve the ability of write operations to quickly write to circuit 300. Bypass circuit 312 may enable circuit 300 to operate in impedance mode, bypass mode, or dual-path mode.

In bypass mode, the latch configuration of circuit 300 does not include impedance element 306 and thus, in the bypass mode, circuit 300 has a time constant that is less than a time constant of circuit 300 in impedance mode. Thus, circuit 300 in bypass mode takes a shorter time to change states than circuit 300 in impedance mode. And, circuit 300 in bypass mode has a shorter write time than circuit 300 in impedance mode. Similarly, in dual-path mode, the latch configuration of circuit 300 has a time constant that is less than the time constant of circuit 300 in impedance mode and the circuit 300 in dual-path mode has a shorter write time than the circuit 300 in impedance mode.

Bypass switch 318 may be closed for circuit 300 to be written to. As a non-limiting example, during a write operation, the access switch may be closed, to provide a voltage state from the BL, or WL, to first node 308 (whether the voltage state is the same as, or different from, the voltage state of first node 308). Further, during the write operation, bypass switch 318 may be closed to set circuit 300 in bypass mode (or dual-path mode). With bypass switch 318 closed, and circuit 300 is in bypass mode (or dual-path mode), first node 308 may achieve the voltage state provided by the BL, or WL, and first inverter 302 and third inverter 314 may maintain the state. First inverter 302 and third inverter 314 may be cause first node 308 to quickly (compared with circuit 300 in impedance mode) achieve the voltage state applied by BL, or WL.

Following the write operation, the access switch may be opened. Following the write operation, bypass switch 318 may remain closed for a first predetermined time duration and enable switch 316 may be closed (or remain closed). During the first predetermined time duration, second node 310 may change (or maintain) its state to be opposite that of first node 308. The first predetermined time duration may be related to the time constant of first path 322 of circuit 300 including impedance element 306, as a non-limiting example, the first predetermined time duration may be a multiple of the time constant of first path 322. First inverter 302 and third inverter 314 may hold the state of circuit 300 while first path 322 changes (or maintains) state to match the state of second path 324, i.e., second path 324 maintains the state of circuit 300 at least until the time constant of first path 322 enables first path 322 to maintain the state of circuit 300.

Following the first predetermined time duration, bypass switch 318 may be opened and circuit 300 may remain in impedance mode to maintain the state of circuit 300 e.g., until a future write operation, without limitation. By holding voltage states in impedance mode, i.e., by including impedance element 306 in the latch configuration, circuit 300 may be more SEU resistant than a latch circuit that does not include an impedance element.

By relatively quickly (compared with a latch circuit including an impedance element but not a bypass path) receiving the voltage state, circuit 300 allows a write operation to occur relatively quickly. Circuit 300 may be capable of being written to as quickly as a similar latch circuit that omits an impedance element.

Thus, circuit 300 may have improved SEU resistance without an increased write time (compared with other latch circuits). Further, the benefits of circuit 300 over other latch circuits may be achieved by adding a relatively small number (e.g., four transistors (e.g., two in third inverter 314, one at enable switch 316, and one at bypass switch 318)) to a basic latch circuit.

Circuit 300 may include control circuit 320 to control enable switch 316 and bypass switch 318 which may control which mode of operation circuit 300 is in. Control circuit 320 may enable or disable one or both of enable switch 316 and bypass switch 318 responsive to operations to set a state of circuit 300. In particular, control circuit 320 may control enable switch 316 and bypass switch 318 responsive to write operations or write enable signal 328.

As a non-limiting example, control circuit 320 may cause bypass switch 318 to be closed or turn ON in response to a write operation or in response to assertion of write enable signal 328. Further, control circuit 320 may cause bypass switch 318 to remain closed or ON for a first predetermined time duration following the write operation (or following the assertion of write enable signal 328). Following the first predetermined time duration, control circuit 320 may cause bypass switch 318 to open or turn OFF. The first predetermined time duration may be related to the time constant (e.g., RC time) of first path 322. As a non-limiting example, the first predetermined time duration may be a multiple (e.g., 2, 3, or 4) of the time constant of first path 322.

In various examples, enable switch 316 may remain closed throughout write operations. In various examples, enable switch 316 may be omitted and circuit 300 may be configured to alternate between impedance mode and dual-path mode (e.g., as described with relation to FIG. 1A). A circuit omitting enable switch 316 may be beneficial at least because it includes one fewer transistor than circuit 300.

In various examples, control circuit 320 may cause enable switch 316 to be open or turn OFF in response to a write operation or in response to assertion of write enable signal 328. Further, control circuit 320 may cause enable switch 316 to remain open or OFF for a second predetermined time duration following the beginning of the write operation. Following the second predetermined time duration, control circuit 320 may cause enable switch 316 to be closed or turn ON. The second predetermined time duration may be related to the first predetermined time duration during which bypass switch 318 is closed. As a non-limiting example, the second predetermined time duration may be half or a third as long as the first predetermined time duration. The second predetermined time duration may occur entirely during the first predetermined time duration. Disabling first path 322 may be beneficial at least because it may allow the BL (or WL) transferring charge to first node 308 to transfer the charge more quickly or efficiently e.g., without interference from second inverter 304 which may be outputting a different voltage level than the voltage level being provided by the BL (or WL). Accordingly, in some examples, the second predetermined time duration may be related to a time duration during which the BL (or WL) is configured to be electrically coupled to circuit 300 during a write operation.

The position of impedance element 306 between the output of first inverter 302 and the input of second inverter 304 is given as a non-limiting example. In other examples, impedance element 306 may be positioned between the output of second inverter 304 and enable switch 316.

Additionally or alternatively, the position of enable switch 316 in first path 322 relative to second inverter 304 is given as a non-limiting example. In other examples, enable switch 316 may be between second node 310 and second inverter 304.

Additionally or alternatively, the orientation of first inverter 302, second inverter 304, and third inverter 314 (i.e., the orientation of the respective inputs and outputs of first inverter 302, second inverter 304, and third inverter 314) is given as a non-limiting example. In other examples, the orientation of all of first inverter 302, second inverter 304, and third inverter 314 may be reversed.

Figure 4:
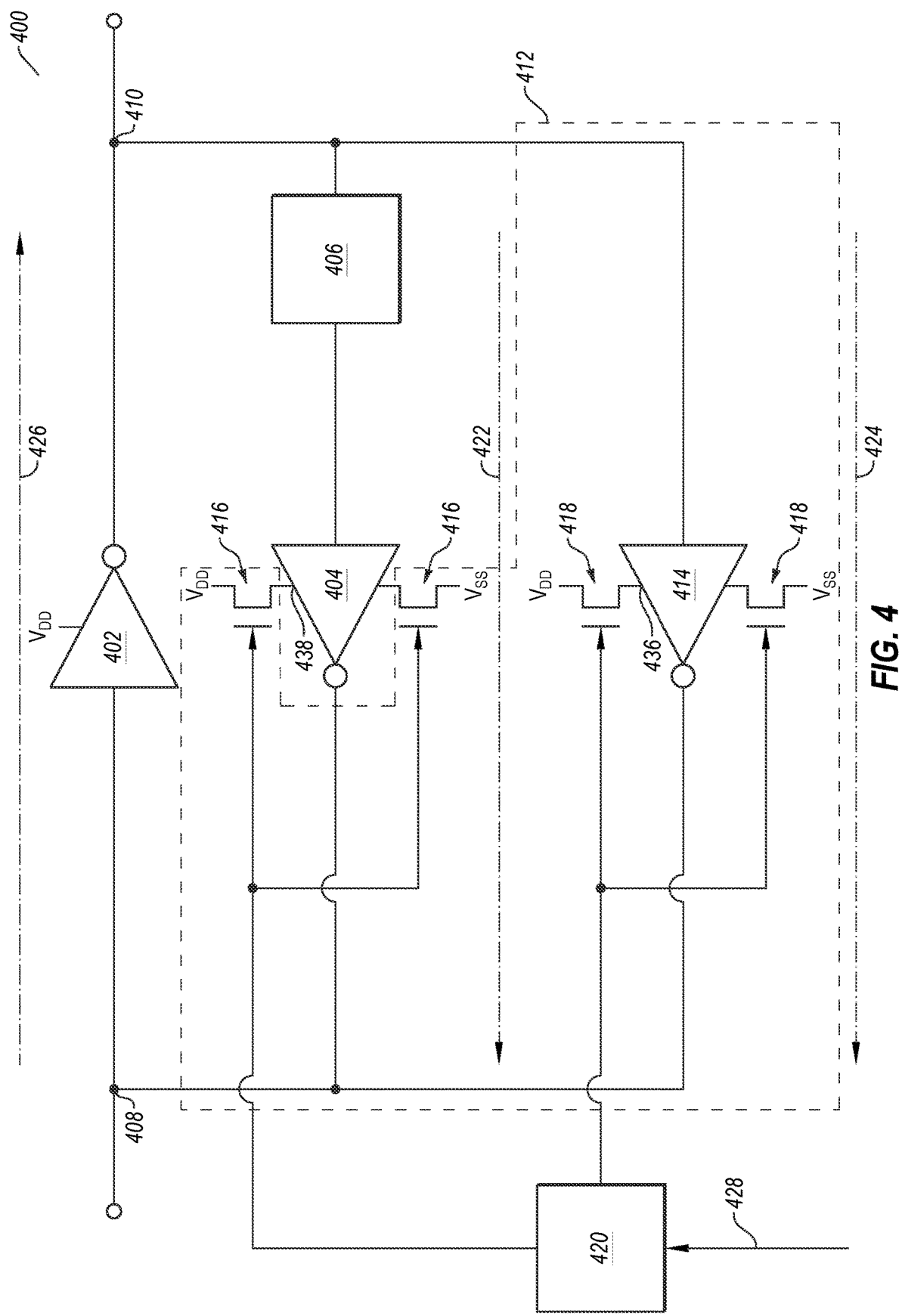
FIG. 4 is a functional block diagram illustrating yet another example circuit according to one or more examples.

FIG. 4 is a functional block diagram illustrating yet another example circuit 400 according to one or more examples. Like circuit 100 and circuit 300, circuit 400 may exhibit SEU resistance without exhibiting an increased write time. As depicted in FIG. 4, circuit 400 includes first inverter 402 cross-coupled to second inverter 404 between first node 408 and second node 410. As depicted in FIG. 4, circuit 400 defines forward path 426 (including first inverter 402) between first node 408 and second node 410. As depicted in FIG. 4, circuit 400 defines first path 422 between second node 410 and first node 408. As depicted in FIG. 4, first path 422 includes impedance element 406 and second inverter 404. As depicted in FIG. 4, circuit 400 defines second path 424 between second node 410 and first node 408. As depicted in FIG. 4, second path 424 includes third inverter 414. As depicted in FIG. 4, circuit 400 includes bypass circuit 412 including enable switches 416, bypass switches 418, and third inverter 414. As depicted in FIG. 3, circuit 400 includes control circuit 420 which receives write enable signal 428.

With reference to FIG. 4, functionally similar features are referred to with similar reference numerals to those used in FIG. 3, incremented by 100. To avoid repetition, not all features shown in FIG. 4 are described in detail herein. Rather, unless described otherwise, a feature designated by a reference numeral that is 100 greater than the reference numeral of a previously-described feature (whether the previously-described feature is first described before the present paragraph, or is first described after the present paragraph) will be understood to be substantially similar to the previously-described feature.

Compared with circuit 300, circuit 400 exhibits an alternative means of selectively cross-coupling third inverter 414 to first inverter 402. In particular, bypass switch 318 is omitted and one or more bypass switches 418 are arranged to selectively decouple third inverter 414 from one or both of $V_{DD}$ and $V_{SS}$. Bypass switches 418 may include one or more switches positioned between $V_{DD}$ and a voltage-supply lead 436 of third inverter 414 or between $V_{SS}$ and another voltage supply lead (not labeled) of third inverter 414. In one example, to enable second path 424, bypass switches 418 are closed to provide power to third inverter 414. To disable second path 424, bypass switches 418 are opened to remove power from third inverter 414.

Similarly, compared with circuit 300, circuit 400 exhibits an alternative means of selectively cross-coupling second inverter 404 to first inverter 402. In particular, enable switch 316 is omitted and one or more enable switches 416 are arranged to selectively decouple second inverter 404 from one or both of $V_{DD}$ and $V_{SS}$. Enable switches 416 may include one or more switches positioned between $V_{DD}$ and a voltage supply lead 438 of second inverter 404 or between $V_{SS}$ and another voltage supply lead (not labeled) of second inverter 404. In one example, to enable first path 422, enable switches 416 are closed to provide power to second inverter 404. To disable first path 422, enable switches 418 are opened to remove power from second inverter 404.

Figure 5:
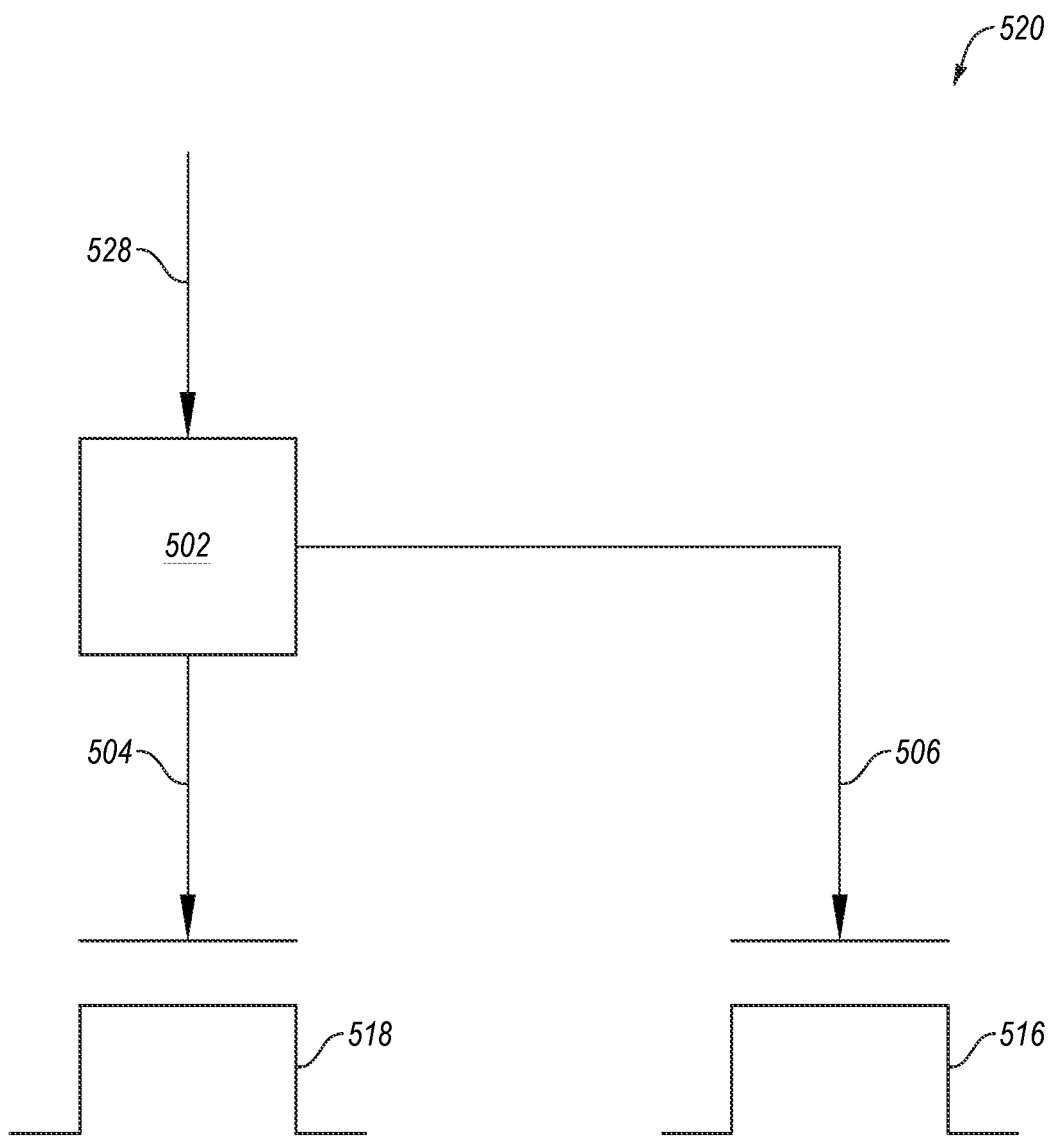
FIG. 5 illustrates an aspect of the subject matter in accordance with one example.

FIG. 5 is a functional block diagram illustrating an example switching circuit 520 according to one or more examples. Switching circuit 520 may be an example of control circuit 320 of FIG. 3 or an example of control circuit 420 of FIG. 4. Switch 518 may be an example of bypass switch 318 of FIG. 3 or an example of bypass switch 418 of FIG. 4. Switch 516 may be an example of enable switch 316 of FIG. 3 or an example of enable switch 416 of FIG. 4. As depicted in FIG. 5, switching circuit 520 includes control circuit 502, switch 516, and switch 518. As depicted in FIG. 5, control circuit 502 may receive write enable signal 528. As depicted in FIG. 5, control circuit 502 may provide control signal 504 to switch 518 may provide control signal 506 to switch 516.

Switching circuit 520 may control switch 518 e.g., to selectively cross-couple an inverter (e.g., third inverter 118 of FIG. 1A, third inverter 314 of FIG. 3, or third inverter 414 of FIG. 4) to another inverter (e.g., first inverter 102 of FIG. 1A, first inverter 302 of FIG. 3, or first inverter 402 of FIG. 4). Additionally, switching circuit 520 may control switch 516 e.g., to selectively cross-couple a second inverter (e.g., second inverter 304 of FIG. 3 or second inverter 404 of FIG. 4) to a respective first inverter (e.g., first inverter 302 of FIG. 3 or first inverter 402 of FIG. 4). Further, switching circuit 520 may control switch 518 to selectively enable or disable a path (e.g., the second path 130 of FIG. 1A, second path 324 of FIG. 3, or second path 424 of FIG. 4) between a first node (e.g., first node 106 of FIG. 1A, first node 308 of FIG. 3, or first node 408 of FIG. 4) and a second node (e.g., second node 108 of FIG. 1A, second node 310 of FIG. 3, or second node 410 of FIG. 4). Additionally, switching circuit 520 may control switch 516 to selectively enable or disable a path (e.g., first path 322 of FIG. 3 or first path 422 of FIG. 4) between the first node 308, 408, respectively, and the second node 310, 410, respectively.

Each of switch 518 and switch 516 may be in line with their respective paths (e.g., as illustrated and described with relation to FIG. 3). Additionally or alternatively, each of switch 518 and switch 516 may be between a power supply and an inverter (e.g., as illustrated and described with relation to FIG. 4).

Switching circuit 520 includes control circuit 502 to control operation (e.g., opening and closing) of switch 518 and switch 516 responsive to write enable signal 528. For example, control circuit 502 may provide control signal 504 to switch 518 according to assertion and de-assertion of write enable signal 528. Control signal 504 may reflect a state of write enable signal 528. Additionally or alternatively, control circuit 502 may provide control signal 506 to switch 516 according to assertion and de-assertion of write enable signal 528. Control signal 506 may reflect a state of write enable signal 528.

Additionally or alternatively, control circuit 502 may include a timing circuit and may provide control signal 504 to close switch 518 for a first predetermined time duration after assertion of write enable signal 528, responsive to the timing circuit. Additionally or alternatively, control circuit 502 may provide control signal 504 to open switch 518 after the first predetermined time duration.

Additionally or alternatively, control circuit 502 may include a timing circuit and may provide control signal 506 to open switch 516 for a second predetermined time duration after assertion of write enable signal 528. Additionally or alternatively, control circuit 502 may provide control signal 506 to close switch 516 after the second predetermined time duration. The second predetermined time duration may be shorter than the first predetermined time duration during which control circuit 502 causes switch 518 to be closed. The second predetermined time duration may occur entirely during the first predetermined time duration. Additionally or alternatively, the second predetermined time duration may be related to a duration of time during which a BL (or WL) is configured to be electrically coupled to the circuit during a write operation.

Control circuit 502 may perform one or more operations of method 200 of FIG. 2 relative to control signal 504 and switch 518. Further, control circuit 502 may perform one or more operations of method 600 of FIG. 6 relative to control signal 506 and switch 516.

Figure 6:
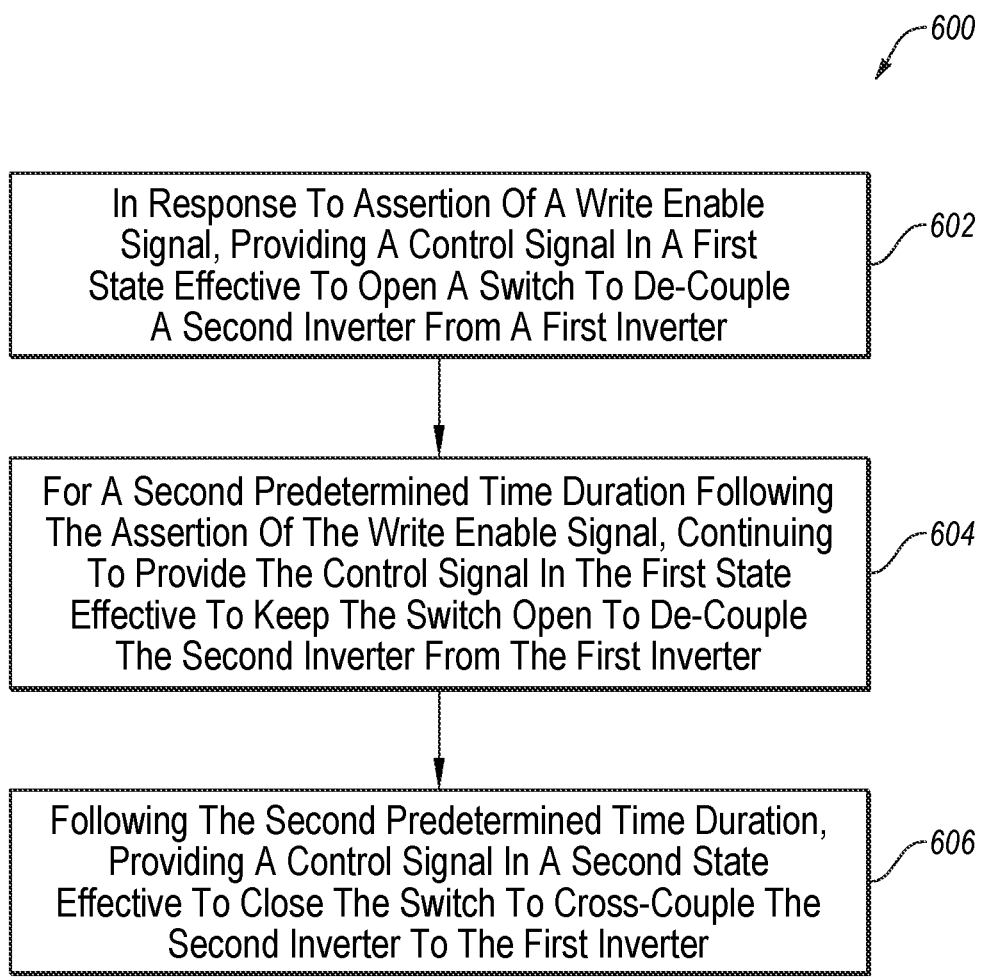
FIG. 6 is a flowchart of another example method of operating a switch, according to one or more examples.

FIG. 6 is a flowchart of an example method 600 of operating a switch, according to one or more examples. As an example, method 600 may be method of operating enable switch 316 of FIG. 3 or enable switch 416 of FIG. 4. At least a portion of method 600 may be performed, in various examples, by a device or system, such as control circuit 320 of FIG. 3, control circuit 420 of FIG. 4, control circuit 502 of switching circuit 520 of FIG. 5 or another device or system. Although illustrated as discrete operations, various operations may be divided into additional operations, combined into fewer operations, or eliminated, depending on the desired implementation.

At operation 602, in response to assertion of a write enable signal, a control signal in a first state may be provided. The control signal in the first state may be effective to open a switch to de-couple a second inverter from a first inverter. Write enable signal 328 of FIG. 3, write enable signal 428 of FIG. 4, or write enable signal 528 of FIG. 5 may be an example of the write enable signal of method 600. Control signal 506 of FIG. 5 may be an example of the control signal of method 600. Enable switch 316 of FIG. 3, enable switch 416 of FIG. 4, or switch 516 of FIG. 5 may be an example of the switch of method 600. Second inverter 304 of FIG. 3 or second inverter 404 of FIG. 4 may be an example of the second inverter of method 600. First inverter 302 of FIG. 3 or first inverter 402 of FIG. 4 may be an example of the first inverter of method 600.

At operation 604, for a second predetermined time duration following the assertion of the write enable signal, the control signal in the first state may continue to be provided. The control signal in the first state may be effective to keep the switch open to de-couple the second inverter from the first inverter.

At operation 606, following the second predetermined time duration, a control signal in a second state may be provided. The control signal in the second state may be effective to close the switch to cross-couple the second inverter to the first inverter.

The second predetermined time duration of method 600 may be related to the first predetermined time duration of method 200. For example, the second predetermined time duration of method 600 may be shorter than the first predetermined time duration of method 200.

Figure 7:
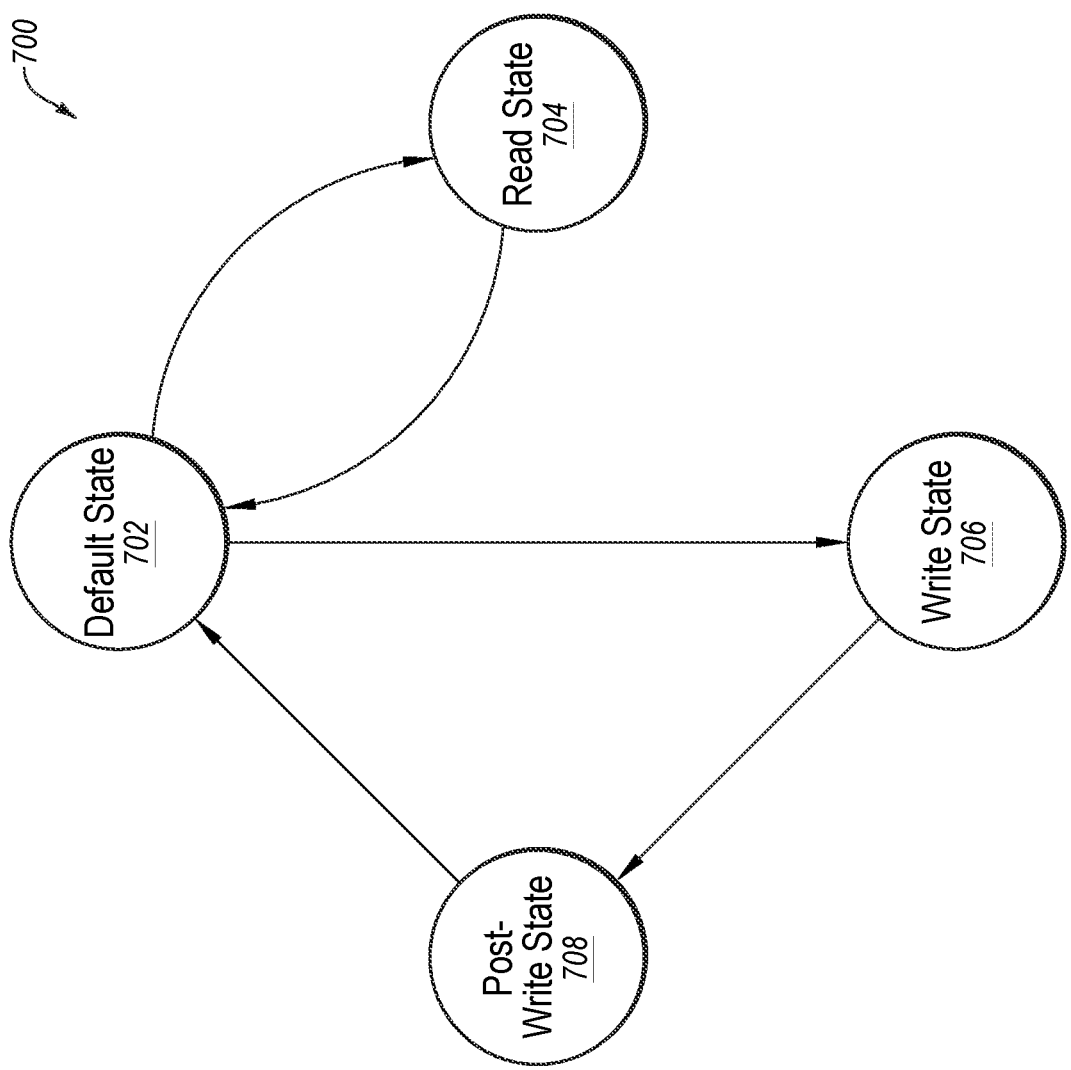
FIG. 7 is a state-machine diagram illustrating a state machine illustrating relationships between states of a storage element according to one or more examples.

FIG. 7 is a state-machine diagram illustrating a state machine 700 that may describe relationships between states of a storage element (e.g., a volatile storage element, without limitation) according to one or more examples. As a non-limiting example, FIG. 7 illustrates relationships between states of circuit 100 of FIG. 1A, circuit 300 of FIG. 3 or circuit 400 of FIG. 4. State machine 700 includes default state 702, read state 704, write state 706, and post-write state 708.

Default state 702 may be the default operational state of the storage element, i.e., the state when the storage element is storing data and data is not being read from the storage element, and data is not being written to the storage element. Referring to circuit 300 of FIG. 3 as a non-limiting example, in default state 702, an access switch (not illustrated) is open, enable switch 316 is closed and bypass switch 318 is open.

In default state 702, circuit 300 is in impedance mode, i.e., the latch configuration of circuit 300 includes first path 322 and not second path 324. Because the latch configuration of circuit 300 includes first path 322 (including impedance element 306) and not second path 324, in default state 702, the storage element may be SEU resistant and have a relatively high time constant (e.g., higher than a time constant of a latch circuit without impedance element 306, without limitation).

Read state 704 may be the operational state of the storage element while data is being read without being changed. Referring to circuit 300 of FIG. 3 as a non-limiting example, in read state 704, the access switch is closed, enable switch 316 is closed, and bypass switch 318 is open. Thus, in read state 704, circuit 300 is in impedance mode, and, similar to default state 702, in read state 704, the storage element may be SEU resistant and have a relatively high time constant. Following read state 704, the storage element may return to default state 702.

In default state 702 and read state 704, the storage element has SEU resistance. Thus, the storage element may be SEU resistant.

Write state 706 may be the operational state of the storage element while data is being written to the storage element. Data may be written whether the state of the storage element is being changed or remaining the same. The write operation may be defined by the time duration during which the BL, or WL, is electrically coupled to the storage element. Additionally, in write state 706, according to one or more examples, enable switch 316 may be either open or closed, and bypass switch 318 is closed.

In write state 706, circuit 300 is in bypass mode (or dual-path mode), i.e., the latch configuration of circuit 300 includes second path 324 (and, in some cases, the first path 322). Because the latch configuration of circuit 300 includes second path 324, in write state 706, the storage element may have a relatively short write time (e.g., shorter than a write time of a circuit omitting the second path, i.e., shorter than a write time of a circuit with impedance element 306 and without the second path 324, without limitation). Because the storage element transitions to write state 706 during write operations, the storage element has a short write time.

Following write state 706, the storage element may transition to post-write state 708. The storage element may stay in post-write state 708 for the first time duration to allow the circuit to stabilize, e.g., for a first node to settle to a first voltage level and a second node to settle to a complementary voltage level. Referring to circuit 300 of FIG. 3 as a non-limiting example, in post-write state 708, the access switch is open, enable switch 316 is closed and bypass switch 318 is closed. In post-write state 708, in cases where the state of the storage element has changed states, the output of second inverter 304 changes to match the output of third inverter 314. The first time duration of post-write state 708 may relate to a time constant of the first path 322 including impedance element 306. Following post-write state 708, the storage element may return to default state 702.

Figure 8:
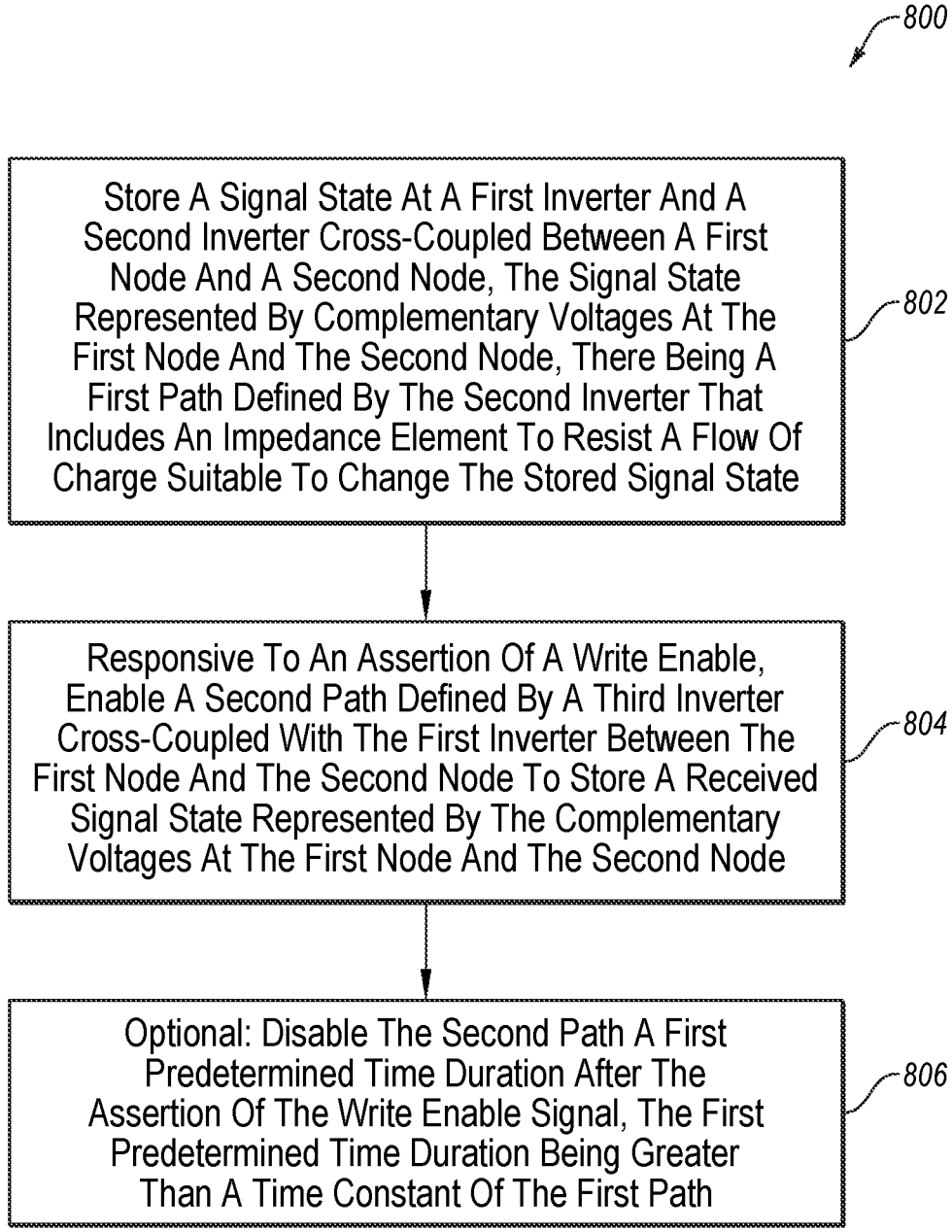
FIG. 8 is a flowchart of an example method of operating a storage element, according to one or more examples.

FIG. 8 is a flowchart of an example method 800 of operating a storage element (e.g., a volatile storage element, without limitation), in accordance with various examples of the disclosure. At least a portion of method 800 may be performed, in various examples, by a device or system, such as circuit 100 of FIG. 1A, circuit 300 of FIG. 3, or circuit 400 of FIG. 4, or another device or system. The states illustrated and described with regard to FIG. 7 may relate to the states described with regard to method 800 of FIG. 8. Although illustrated as discrete operations, various operations may be divided into additional operations, combined into fewer operations, or eliminated, depending on the desired implementation.

At operation 802, a signal state may be stored at a first inverter and a second inverter. The first inverter and the second inverter may be cross-coupled between a first node and a second node. The signal state may be represented by complementary voltages at the first node and the second node. There may be a first path defined by the second inverter that includes an impedance element to resist a flow of charge suitable to change the stored signal state e.g., responsive to an SEU.

At operation 804, responsive to an assertion of a write enable signal, a second path may be enabled. The second path may be defined by a third inverter cross-coupled with the first inverter between the first node and the second node to store a received signal state represented by complementary voltages at the first node and the second node.

At operation 806, which is optional, the second path may be disabled a first predetermined time duration after the assertion of the write enable signal. The first predetermined time duration may be greater than a time constant of the first path.

Figure 9:
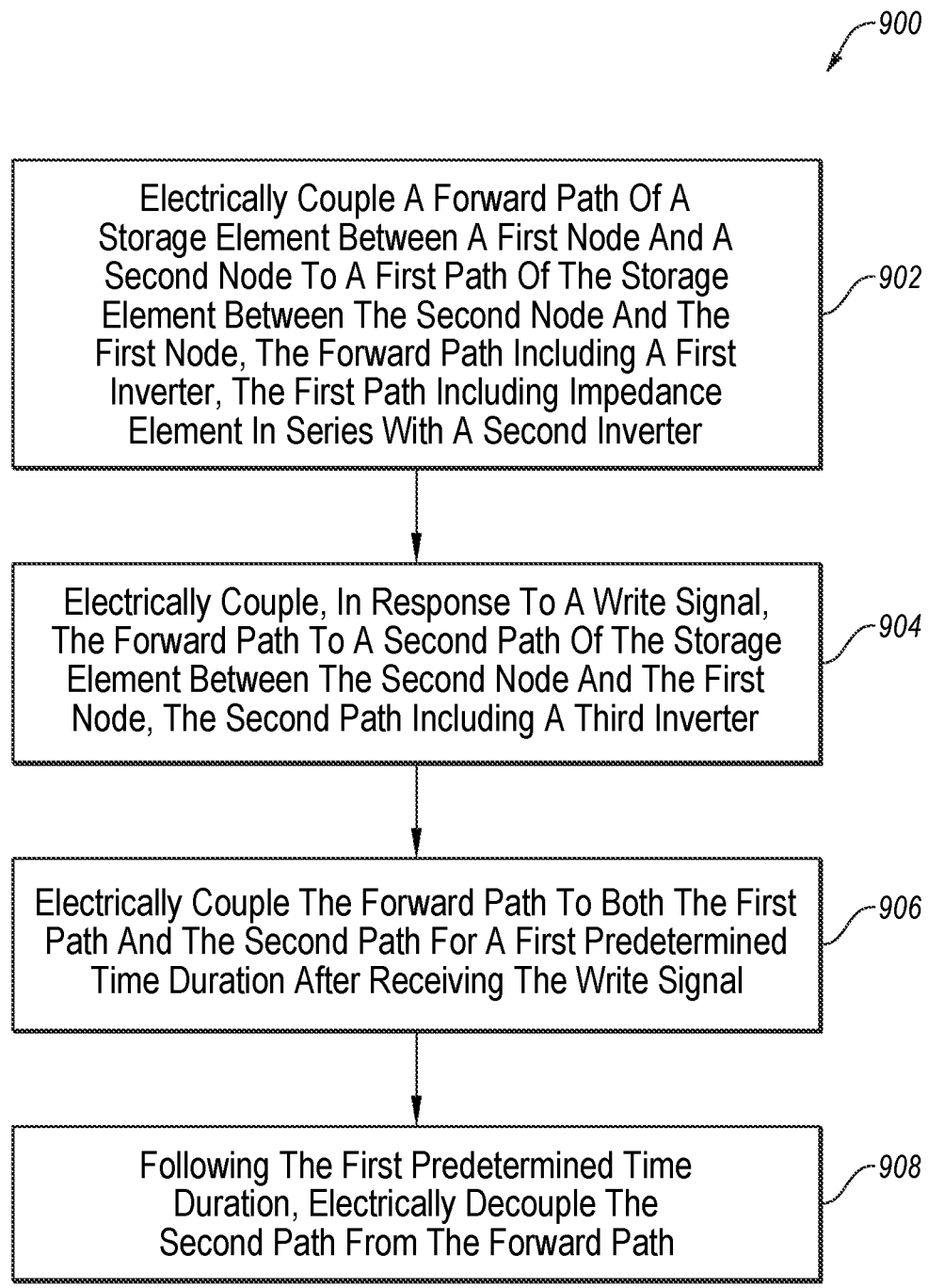
FIG. 9 is a flowchart of another example method of operating a storage element, according to one or more examples.

FIG. 9 is a flowchart of an example method 900 of operating a storage element (e.g., a volatile storage element, without limitation), in accordance with various examples of the disclosure. At least a portion of method 900 may be performed, in various examples, by a device or system, such as circuit 100 of FIG. 1A, circuit 300 of FIG. 3, or circuit 400 of FIG. 4, or another device or system. The states illustrated and described with regard to FIG. 7 may relate to the states described with regard to method 900 of FIG. 9. Although illustrated as discrete operations, various operations may be divided into additional operations, combined into fewer operations, or eliminated, depending on the desired implementation.

At operation 902, a forward path between a first node and a second node of a storage element may be electrically coupled to a first path of the storage element between the second node and the first node. The forward path may include a first inverter. The first path may include an impedance element in series with a second inverter. Referring to FIG. 3, as a non-limiting example, first node 308 may be a non-limiting example of the first node of operation 902, second node 310 may be a non-limiting example of the second node of operation 902, and forward path 326 may be a non-limiting example of the forward path of operation 902. Further, first inverter 302 may be a non-limiting example of the first inverter of operation 902, first path 322 may be a non-limiting example of the first path, impedance element 306 may be a non-limiting example of the impedance element of operation 902, and second inverter 304 may be a non-limiting example of the second inverter of operation 902. Operation 902 may correspond to the impedance mode as described above with regard to FIG. 3. Referring to FIG. 7, as a non-limiting example, operation 902 may correspond to either default state 702 or read state 704.

At operation 904, the forward path may be electrically coupled to a second path of the storage element between the second node and the first node. The second path may include a third inverter. Referring to FIG. 3 as a non-limiting example, second path 324 may be a non-limiting example of the second path of operation 904 and third inverter 314 may be a non-limiting example of the third inverter of operation 904. Operation 904 may correspond to bypass mode or dual-path mode as described above with regard to FIG. 3. Referring to FIG. 7 as a non-limiting example, operation 904 may correspond to write state 706.

At operation 906, the forward path may be electrically coupled to both the first path and the second path for a first predetermined time duration. Referring to FIG. 3 as a non-limiting example, the first predetermined time duration may relate to a time constant of first path 322. Operation 906 may correspond to dual-path mode as described above with regard to FIG. 3. Referring to FIG. 7 as a non-limiting example, operation 906 may correspond to one or both write state 706 and post-write state 708.

At operation 908, following the first predetermined time duration, the second path may be electrically decoupled from the forward path. Operation 908 may correspond to a return to impedance mode as described above with regard to FIG. 3. Referring to FIG. 7, as a non-limiting example, operation 908 may correspond to a return to default state 702.

Figure 10:
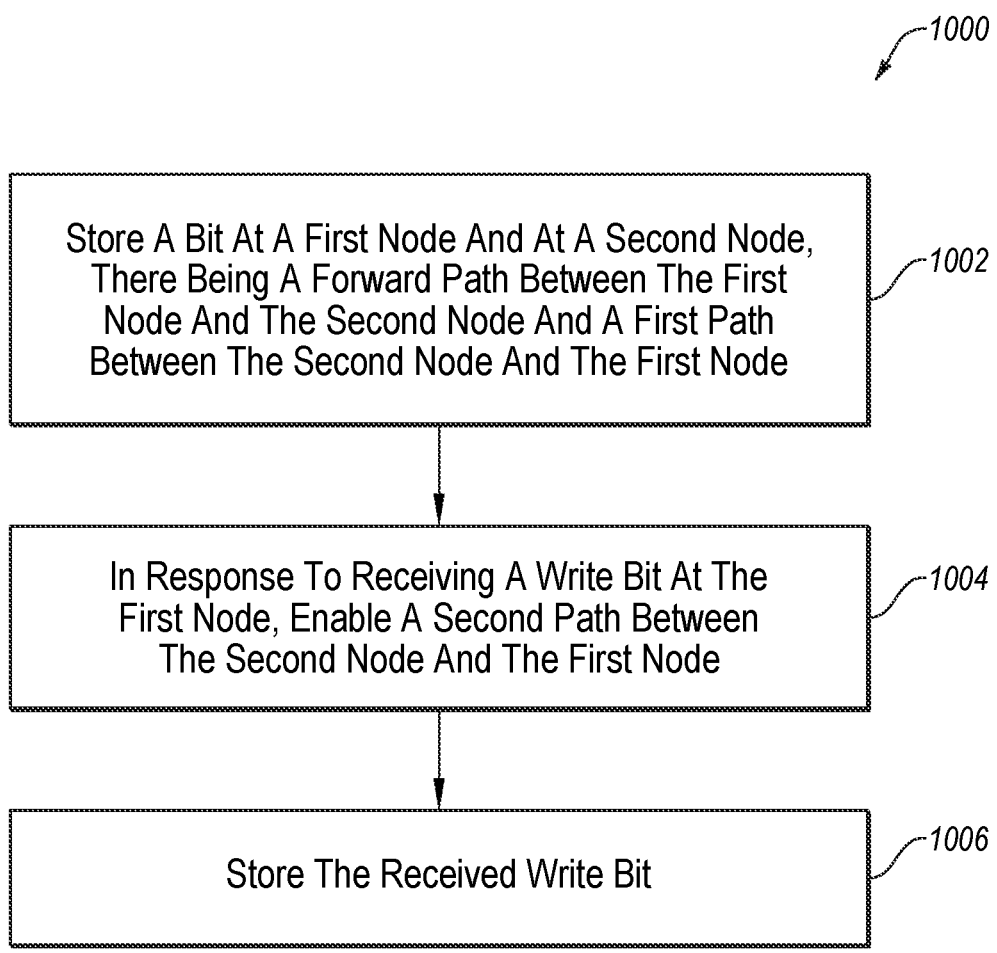
FIG. 10 is a flowchart of yet another example method of operating a storage element, according to one or more examples.

FIG. 10 is a flowchart of another example method 1000 of operating a storage element, in accordance with various examples of the disclosure. At least a portion of method 1000 may be performed, in various examples, by a device or system, such as circuit 100 of FIG. 1A, circuit 300 of FIG. 3, or circuit 400 of FIG. 4, or another device or system. The states illustrated and described with regard to FIG. 7 may relate to the states described with regard to method 1000 of FIG. 10. Although illustrated as discrete operations, various operations may be divided into additional operations, combined into fewer operations, or eliminated, depending on the desired implementation.

At operation 1002, a bit may be stored at a first node and at a second node (e.g., a bit, either a "1" or a "0" may be represented as one of a "high" voltage or a "low" voltage at the first node and as the other of the "high voltage" or the "low" voltage at the second node). There may be a forward path between the first node and the second node and a first path comprising an impedance element between the second node and the first node.

At operation 1004, in response to receiving a write bit at the first node, enabling a second path, having a lower time constant than the first path, e.g., without an impedance element, between the second node and the first node may be enabled.

At operation 1006, the received write bit may be stored. The write bit may be the same as the bit stored at operation 1002, i.e., the write bit may be stored as the "high" voltage or the "low" voltage at the first node and the other of the "high" voltage or the "low voltage" at the second node. Alternatively, the write bit may be different from the bit stored at the operation 1002, in such a case, the write bit may be stored as the other of the "high" voltage or "low" voltage at the first node and as the "high" voltage or the "low" voltage at the second node.

FIG. 11 is a functional operation diagram illustrating an example field programmable gate array (FPGA) 1102 according to one or more examples. Examples of the present disclosure may have application in configuration cells 1104 of FPGAs (e.g., FPGA 1102, without limitation). For example, each of the configuration cells 1104 may be an instance of a circuit 100 of FIG. 1A, a circuit 300 of FIG. 3, or a circuit 400 of FIG. 4, without limitation. Additionally or alternatively, configuration cells 1104 may be configured to perform one or more of the operations described with relation to method 600 of FIG. 6, method 800 of FIG. 8, method 900 of FIG. 9, or method 1000 of FIG. 10, without limitation. Further, various examples may have application in configuration cells 1104 in basic logic voltage (LV) domain 1106 of FPGAs (e.g., FPGA 1102, without limitation). The LV domain 1106 may include voltage supply lines at a particular voltage level (e.g., VDDs or VSSs that provide voltage at the particular voltage level), elements, or circuits that use voltage at the particular voltage level. The particular voltage level may be lower than another particular voltage level of another domain (e.g., a high-voltage domain). As a non-limiting example, various examples may be implemented in LV configuration cells 1104 of FPGAs (e.g., FPGA 1102, without limitation) because the examples may improve SEU resistance without increasing the size of the LV configuration cells 1104 beyond acceptable limits, without increasing power consumption of the LV configuration cells 1104 beyond acceptable limits, or without increasing write time of the LV configuration cells 1104 beyond acceptable limits. However, the present disclosure is not limited to FPGAs, configuration cells, or LV applications.

Figure 12:
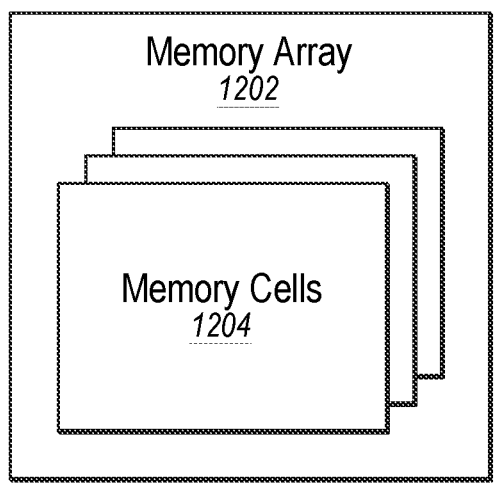
FIG. 12 is a functional block diagram illustrating an example memory array according to one or more examples.

FIG. 12 is a functional block diagram illustrating an example memory array 1202 according to one or more examples. Examples of the present disclosure may have application in memory cells 1204 of memory array 1202. For example, each of the memory cells 1204 may be an instance of a circuit 100 of FIG. 1A, a circuit 300 of FIG. 3, or a circuit 400 of FIG. 4, without limitation. Additionally or alternatively, memory cells 1204 may be configured to perform one or more of the operations described with relation to method 600 of FIG. 6, method 800 of FIG. 8, method 900 of FIG. 9, or method 1000 of FIG. 10, without limitation. Because each of memory cells 1204 may be SEU resistant, memory array 1202 may be SEU resistant.

As used in the present disclosure, the term "combination" with reference to a plurality of elements may include a combination of all the elements or any of various different sub-combinations of some of the elements. For example, the phrase "A, B, C, D, or combinations thereof" may refer to any one of A, B, C, or D; the combination of each of A, B, C, and D; and any sub-combination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting examples of the disclosure may include:

Example 1: An apparatus, comprising: a first inverter and a second inverter cross-coupled between a first node and a second node to store a signal state represented by complementary voltages at the first node and the second node; a first path defined by the second inverter that includes an impedance element in series with the second inverter so as to resist a flow of charge suitable to change the stored signal state; and the first inverter and a third inverter selectively cross-coupled between the first node and the second node to store a received signal state represented by the complementary voltages at the first node and the second node responsive to an assertion of a write enable signal.

Example 2: The apparatus according to Example 1, comprising a second path defined by the third inverter, the second path including an inline switch arranged to close responsive to the assertion of the write enable signal to cross-couple the first inverter and the third inverter between the first node and the second node.

Example 3: The apparatus according to any of Examples 1 and 2, comprising a control circuit, an output of the control circuit coupled to an enable input of the inline switch, the control circuit to close the inline switch responsive to the assertion of the write enable signal and to keep the inline switch closed for a first predetermined time duration following the assertion of the write enable signal.

Example 4: The apparatus according to any of Examples 1 through 3, wherein the control circuit to open the inline switch responsive to an end of the first predetermined time duration.

Example 5: The apparatus according to any of Examples 1 through 4, wherein the first predetermined time duration is greater than a time constant of the first path.

Example 6: The apparatus according to any of Examples 1 through 5, comprising a control circuit, the control circuit and the inline switch coupled to keep the first inverter and the third inverter cross-coupled between the first node and the second node for a first predetermined time duration following the assertion of the write enable signal.

Example 7: The apparatus according to any of Examples 1 through 6, comprising a switch coupled between a voltage supply lead of the third inverter and a voltage supply, the switch arranged to close responsive to the assertion of the write enable signal to thereby selectively cross-couple the first inverter and the third inverter.

Example 8: The apparatus according to any of Examples 1 through 7, comprising a control circuit and a switch coupled between a voltage supply lead of the third inverter and a voltage supply, the control circuit to open the switch after a first predetermined time duration after the assertion of the write enable signal.

Example 9: The apparatus according to any of Examples 1 through 8, wherein the impedance element is one of: a virgin resistive random access memory, an antifuse, or a vertical resistor.

Example 10: An apparatus, comprising: a first inverter and a second inverter selectively cross-coupled between a first node and a second node to store a signal state represented by complementary voltages at the first node and the second node; a first path defined by the second inverter that includes an impedance element to resist a flow of charge suitable to change the stored signal state; and the first inverter and a third inverter selectively cross-coupled between the first node and the second node to store a received signal state represented by the complementary voltages at the first node and the second node responsive to an assertion of a write enable signal.

Example 11: The apparatus according to Example 10, wherein the first path includes a respective inline switch arranged to turn open responsive to the assertion of the write enable signal to de-couple the first inverter and the second inverter between the first node and the second node.

Example 12: The apparatus according to any of Examples 10 and 11, comprising a control circuit to cause the inline switch of the first path to close following a second predetermined time duration after the assertion of the write enable signal to cross-couple the first inverter and the second inverter between the first node and the second node.

Example 13: The apparatus according to any of Examples 10 through 12, comprising a switch coupled between a voltage supply lead of the second inverter and a voltage supply and arranged to open responsive to the assertion of the write enable signal to de-couple the first inverter and the second inverter between the first node and the second node.

Example 14: The apparatus according to any of Examples 10 through 13, comprising a control circuit to cause the switch to close after a second predetermined time duration after the assertion of the write enable signal to cross-couple the first inverter and the second inverter between the first node and the second node.

Example 15: A method comprising: storing a signal state at a first inverter and a second inverter cross-coupled between a first node and a second node, the signal state represented by complementary voltages at the first node and the second node, there being a first path defined by the second inverter that includes an impedance element to resist a flow of charge suitable to change the signal state; and responsive to an assertion of a write enable signal, enabling a second path defined by a third inverter cross-coupled with the first inverter between the first node and the second node to store a received signal state represented by the complementary voltages at the first node and the second node.

Example 16: The method according to Example 15, comprising disabling the second path a first predetermined time duration after the assertion of the write enable signal, the first predetermined time duration longer than a time constant of the first path.

Example 17: The method according to any of Examples 15 and 16, wherein enabling the second path comprises closing an inline switch of the second path.

Example 18: The method according to any of Examples 15 through 17, wherein enabling the second path comprises closing a switch coupled between a voltage supply lead of the third inverter and a voltage supply.

Example 19: The method according to any of Examples 15 through 18, comprising disabling the first path responsive to the assertion of the write enable signal.

Example 20: The method according to any of Examples 15 through 19, comprising enabling the first path a second predetermined time duration after the assertion of the write enable signal.

Example 21: The method according to any of Examples 15 through 20, wherein disabling the first path comprises opening an inline switch of the first path.

Example 22: The method according to any of Examples 15 through 21, wherein disabling the first path comprises opening a switch coupled between a voltage supply lead of the second inverter and a voltage supply.

Example 23: An apparatus including a volatile storage element. The volatile storage element may include a forward path, a first feedback path, and a second feedback path. The forward path may be arranged to couple a first node to a second node. The forward path may be configured to provide a stored bit at a logic voltage level at the second node. The first feedback path may be configured to provide the stored bit at a storage voltage level to the first node. The first feedback path may include an impedance element. The impedance element may be characterized by a resistance to an inducement of a flow of a charge suitable to change a state of a transistor of the volatile storage device. The second feedback path may be configured to selectively provide the stored bit at the storage voltage level to the first node.

Example 24: An apparatus including a forward path, a high-impedance return path, and a bypass return path. The forward path may be arranged to couple a first node and a second node. The high-impedance return path may be arranged between the second node and the first node. The bypass return path may be arranged between the second node and the first node. The apparatus may be configured to, during a write operation, enable the bypass return path and, after the write operation, disable the bypass return path.

Example 25: An apparatus including a field programmable gate array. The field programmable gate array may include a configuration cell. The configuration cell may include a forward path, a high-impedance return path, and a bypass return path. The forward path may be arranged to couple a first node and a second node. The high-impedance return path may be arranged between the second node and the first node. The bypass return path may be arranged between the second node and the first node. The configuration cell configured to, during a write operation, enable the bypass return path and, after the write operation, disable the bypass return path.

Example 26: A method including storing a bit as a storage voltage level at a first node and a logic voltage level at a second node. There may be a forward path between the first node and the second node and a high-impedance return path between the second node and the first node. The method may also include, in response to receiving a write bit at the first node, enabling a bypass return path between the second node and the first node. The method may also include storing the received write bit.

Example 27: A method including electrically coupling a first path of a storage element between a first node and a second node to a high-impedance path of the storage element between the second node and the first node. The first path may include a first inverter. The high-impedance path may include a high-impedance element and a second inverter. The method may also include electrically coupling, in a write state (or in response to a write signal), the first path to a bypass path of the storage element between the second node and the first node. The bypass path may include a third inverter. The method may also include electrically coupling the first path to both the high-impedance path and the bypass path for a time duration after the write state (or in response to the write signal). The method may also include, following the time duration, electrically decoupling the bypass path from the first path.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:
   a first inverter and a second inverter cross-coupled between a first node and a second node to store a signal state represented by complementary voltages at the first node and the second node;
   a first path defined by the second inverter that includes an impedance element in series with the second inverter so as to resist a flow of charge suitable to change the stored signal state; and
   the first inverter and a third inverter selectively cross-coupled between the first node and the second node to store a received signal state represented by the complementary voltages at the first node and the second node responsive to an assertion of a write enable signal.

2. The apparatus of claim 1, comprising a second path defined by the third inverter, the second path including an inline switch arranged to close responsive to the assertion of the write enable signal to cross-couple the first inverter and the third inverter between the first node and the second node.

3. The apparatus of claim 2, comprising a control circuit, an output of the control circuit coupled to an enable input of the inline switch, the control circuit to close the inline switch responsive to the assertion of the write enable signal and to keep the inline switch closed for a first predetermined time duration following the assertion of the write enable signal.

4. The apparatus of claim 3, wherein the control circuit to open the inline switch responsive to an end of the first predetermined time duration.

5. The apparatus of claim 3, wherein the first predetermined time duration is greater than a time constant of the first path.

6. The apparatus of claim 2, comprising a control circuit, the control circuit and the inline switch coupled to keep the first inverter and the third inverter cross-coupled between the first node and the second node for a first predetermined time duration following the assertion of the write enable signal.

7. The apparatus of claim 1, comprising a switch coupled between a voltage supply lead of the third inverter and a voltage supply, the switch arranged to close responsive to the assertion of the write enable signal to thereby selectively cross-couple the first inverter and the third inverter.

8. The apparatus of claim 1, comprising a control circuit and a switch coupled between a voltage supply lead of the third inverter and a voltage supply, the control circuit to open the switch after a first predetermined time duration after the assertion of the write enable signal.

9. The apparatus of claim 1, wherein the impedance element is one of: a virgin resistive random access memory, an antifuse, or a vertical resistor.

10. An apparatus, comprising:
    a first inverter and a second inverter selectively cross-coupled between a first node and a second node to store a signal state represented by complementary voltages at the first node and the second node;
    a first path defined by the second inverter that includes an impedance element to resist a flow of charge suitable to change the stored signal state; and
    the first inverter and a third inverter selectively cross-coupled between the first node and the second node to store a received signal state represented by the complementary voltages at the first node and the second node responsive to an assertion of a write enable signal.

11. The apparatus of claim 10, wherein the first path includes a respective inline switch arranged to turn open responsive to the assertion of the write enable signal to de-couple the first inverter and the second inverter between the first node and the second node.

12. The apparatus of claim 11, comprising a control circuit to cause the inline switch of the first path to close following a second predetermined time duration after the assertion of the write enable signal to cross-couple the first inverter and the second inverter between the first node and the second node.

13. The apparatus of claim 12, comprising a switch coupled between a voltage supply lead of the second inverter and a voltage supply and arranged to open responsive to the assertion of the write enable signal to de-couple the first inverter and the second inverter between the first node and the second node.

14. The apparatus of claim 13, comprising a control circuit to cause the switch to close after a second predetermined time duration after the assertion of the write enable signal to cross-couple the first inverter and the second inverter between the first node and the second node.

15. A method comprising:
storing a signal state at a first inverter and a second inverter cross-coupled between a first node and a second node, the signal state represented by complementary voltages at the first node and the second node, there being a first path defined by the second inverter that includes an impedance element to resist a flow of charge suitable to change the signal state; and
responsive to an assertion of a write enable signal, enabling a second path defined by a third inverter cross-coupled with the first inverter between the first node and the second node to store a received signal state represented by the complementary voltages at the first node and the second node.

16. The method of claim 15, comprising disabling the second path a first predetermined time duration after the assertion of the write enable signal, the first predetermined time duration longer than a time constant of the first path.

17. The method of claim 15, wherein enabling the second path comprises closing an inline switch of the second path.

18. The method of claim 15, wherein enabling the second path comprises closing a switch coupled between a voltage supply lead of the third inverter and a voltage supply.

19. The method of claim 15, comprising disabling the first path responsive to the assertion of the write enable signal.

20. The method of claim 19, comprising enabling the first path a second predetermined time duration after the assertion of the write enable signal.

21. The method of claim 19, wherein disabling the first path comprises opening an inline switch of the first path.

22. The method of claim 19, wherein disabling the first path comprises opening a switch coupled between a voltage supply lead of the second inverter and a voltage supply.

* * * * *